(12) United States Patent
Park et al.

(10) Patent No.: US 12,183,732 B2
(45) Date of Patent: Dec. 31, 2024

(54) SEMICONDUCTOR DEVICES INCLUDING AN ISOLATION INSULATING PATTERN ON A BOUNDARY REGION OF A SUBSTRATE AND BETWEEN FIRST ACTIVE PATTERNS AND SECOND ACTIVE PATTERNS

(71) Applicant: Samsung Electronics Co., Ltd., Suwon-si (KR)

(72) Inventors: Inwon Park, Yongin-si (KR); Bosoon Kim, Yongin-si (KR); Jongsoon Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/326,522

(22) Filed: May 31, 2023

(65) Prior Publication Data

US 2023/0307451 A1 Sep. 28, 2023

Related U.S. Application Data

(63) Continuation of application No. 17/394,991, filed on Aug. 5, 2021, now Pat. No. 11,705,451.

(30) Foreign Application Priority Data

Dec. 17, 2020 (KR) .......................... 10-2020-0177715

(51) Int. Cl.
*H01L 27/088* (2006.01)
*B82Y 10/00* (2011.01)
(Continued)

(52) U.S. Cl.
CPC ...... *H01L 27/088* (2013.01); *H01L 21/76224* (2013.01); *H01L 27/0207* (2013.01);
(Continued)

(58) Field of Classification Search
CPC ............... H01L 29/0653; H01L 21/762; H01L 21/76224; H01L 21/823878;
(Continued)

(56) References Cited

U.S. PATENT DOCUMENTS 7,728,381 B2  6/2010  Kahng et al.
7,732,343 B2  6/2010  Niroomand et al.
(Continued)

FOREIGN PATENT DOCUMENTS

KR  101688699 B1  1/2017

*Primary Examiner* — Sonya McCall-Shepard
(74) *Attorney, Agent, or Firm* — HARNESS, DICKEY & PIERCE, P.L.C.

(57) ABSTRACT

A semiconductor device includes a substrate including a boundary region between first and second regions, first active patterns on the first region, second active patterns on the second region, and an isolation insulating pattern on the boundary region between the first and second active patterns. A width of at least some of the first active patterns have different widths. Widths of the second active patterns may be equal to each other. A bottom surface of the isolation insulating pattern includes a first bottom surface adjacent to a corresponding first active pattern, a second bottom surface adjacent to a corresponding second active pattern, and a third bottom surface between the first bottom surface and the second bottom surface. The third bottom surface is located at a different height from those of the first and second bottom surfaces with respect to a bottom surface of the substrate.

19 Claims, 22 Drawing Sheets

(51) Int. Cl.

| | | |
|---|---|---|
| *H01L 21/308* | (2006.01) | |
| *H01L 21/762* | (2006.01) | |
| *H01L 21/8234* | (2006.01) | |
| *H01L 27/02* | (2006.01) | |
| *H01L 27/085* | (2006.01) | |
| *H01L 29/06* | (2006.01) | |
| *H01L 29/423* | (2006.01) | |
| *H01L 29/66* | (2006.01) | |
| *H01L 29/775* | (2006.01) | |
| *H01L 29/78* | (2006.01) | |
| *H01L 29/786* | (2006.01) | |

(52) U.S. Cl.
CPC ...... *H01L 27/0886* (2013.01); *H01L 29/0673* (2013.01); *H01L 29/42392* (2013.01); *H01L 29/775* (2013.01); *H01L 29/78696* (2013.01)

(58) Field of Classification Search
CPC ........... H01L 29/7851; H01L 21/31144; H01L 21/32139; H01L 21/0337; H01L 27/0886; H01L 29/0673; H01L 29/42392; H01L 29/775; H01L 29/78696; H01L 21/823412; H01L 29/785; H01L 21/823481; H01L 29/0649
See application file for complete search history.

(56) References Cited

U.S. PATENT DOCUMENTS

| | | |
|---|---|---|
| 9,472,506 B2 | 10/2016 | Conklin et al. |
| 9,691,868 B2 | 6/2017 | Song et al. |
| 9,755,049 B2 | 9/2017 | Paak et al. |
| 10,043,703 B2 | 8/2018 | Bouche et al. |
| 10,096,479 B2 | 10/2018 | Yoo |
| 10,304,680 B1 | 5/2019 | Lee et al. |
| 2015/0325646 A1 | 11/2015 | Lai et al. |
| 2019/0139814 A1 | 5/2019 | Wu et al. |
| 2019/0280087 A1 | 9/2019 | Park et al. |
| 2019/0386099 A1* | 12/2019 | Kim ............... H01L 29/0649 |

* cited by examiner

SEMICONDUCTOR DEVICES INCLUDING AN ISOLATION INSULATING PATTERN ON A BOUNDARY REGION OF A SUBSTRATE AND BETWEEN FIRST ACTIVE PATTERNS AND SECOND ACTIVE PATTERNS

CROSS-REFERENCE TO RELATED APPLICATION

This U.S. non-provisional patent application is a continuation of U.S. patent application Ser. No. 17/394,991, filed Aug. 5, 2021, which claims priority under 35 U.S.C. § 119 to Korean Patent Application No. 10-2020-0177715, filed on Dec. 17, 2020 in the Korean Intellectual Property Office, the disclosure of each of which is hereby incorporated by reference in its entirety.

BACKGROUND

Embodiments of inventive concepts relate to semiconductor devices and/or methods of manufacturing the same, and more particularly, to semiconductor devices including active patterns having various widths or pitches and methods of manufacturing the same.

Semiconductor devices may include integrated circuits including metal-oxide-semiconductor field effect transistors (MOSFETs). MOS field effect transistors may include active patterns formed by patterning a substrate, and gate structures intersecting the active patterns. The active patterns may have various widths or pitches according to operating characteristics of the MOS field effect transistors. In addition, various methods for forming semiconductor devices that have excellent performance while overcoming limitations by the high integration have been studied.

SUMMARY

Embodiments of inventive concepts may provide semiconductor devices capable of easily forming active patterns having various widths or pitches, and/or methods of manufacturing the same.

Embodiments of inventive concepts may also provide semiconductor devices capable of reducing manufacturing costs, and/or methods of manufacturing the same.

In an embodiment, a semiconductor device may include a substrate including a first region, a second region, and a boundary region between the first region and the second region; first active patterns on the first region of the substrate; second active patterns on the second region of the substrate; and an isolation insulating pattern on the boundary region of the substrate and between the first active patterns and the second active patterns. A width of at least one of the first active patterns may be different from a width of another of the first active patterns, and widths of the second active patterns may be equal to each other. The isolation insulating pattern may be between a corresponding first active pattern of the first active patterns and a corresponding second active pattern of the second active patterns. A bottom surface of the isolation insulating pattern may include a first bottom surface adjacent to the corresponding first active pattern, a second bottom surface adjacent to the corresponding second active pattern, and a third bottom surface between the first bottom surface and the second bottom surface. The third bottom surface may be located at a different height from a height of the first bottom surface and a height of the second bottom surface with respect to a bottom surface of the substrate.

In an embodiment, a semiconductor device may include a substrate including a first region, a second region, and a boundary region between the first region and the second region; first active patterns on the first region of the substrate and spaced apart from each other in a first direction parallel to a bottom surface of the substrate; second active patterns on the second region of the substrate and spaced apart from each other in the first direction; and an isolation insulating pattern on the boundary region of the substrate between the first active patterns and the second active patterns. Each of the first active patterns and the second active patterns may have a width in the first direction. At least some of the first active patterns may have different widths. The second active patterns may have equal widths. The isolation insulating pattern may be between a corresponding first active pattern of the first active patterns and a corresponding second active pattern of the second active patterns. A bottom surface of the isolation insulating pattern may include a first bottom surface adjacent to the corresponding first active pattern, a second bottom surface adjacent to the corresponding second active pattern, and a recess surface recessed from the first bottom surface and the second bottom surface into the substrate.

In an embodiment, a semiconductor device may include a substrate including a first region, a second region, and a boundary region between the first region and the second region; first active patterns on the first region of the substrate and spaced apart from each other in a first direction parallel to a bottom surface of the substrate; second active patterns on the second region of the substrate and spaced apart from each other in the first direction; and an isolation insulating pattern on the boundary region of the substrate, the isolation insulating pattern between the first active patterns and the second active patterns. Each of the first active patterns and the second active patterns may have a width in the first direction. At least some of the first active patterns may have different widths. The second active patterns may have equal widths. The isolation insulating pattern may be between a corresponding first active pattern of the first active patterns and a corresponding second active pattern of the second active patterns. A bottom surface of the isolation insulating pattern may include a first bottom surface adjacent to the corresponding first active pattern, a second bottom surface adjacent to the corresponding second active pattern, and a protrusion surface protruding from the first bottom surface and the second bottom surfaces toward an inside of the isolation insulating pattern.

BRIEF DESCRIPTION OF THE DRAWINGS

Inventive concepts will become more apparent in view of the attached drawings and accompanying detailed description.

FIG. 15 is a cross-sectional view corresponding to the line I-I' of FIG. 12, and FIG. 16 is a cross-sectional view corresponding to the lines II-II' and III-III' of FIG. 12.

DETAILED DESCRIPTION OF THE EMBODIMENTS

Hereinafter, embodiments of inventive concepts will be described in detail with reference to the accompanying drawings.

FIGS. 1 to 11 are cross-sectional views illustrating a method of manufacturing a semiconductor device according to some embodiments of inventive concepts.

Figure 1:
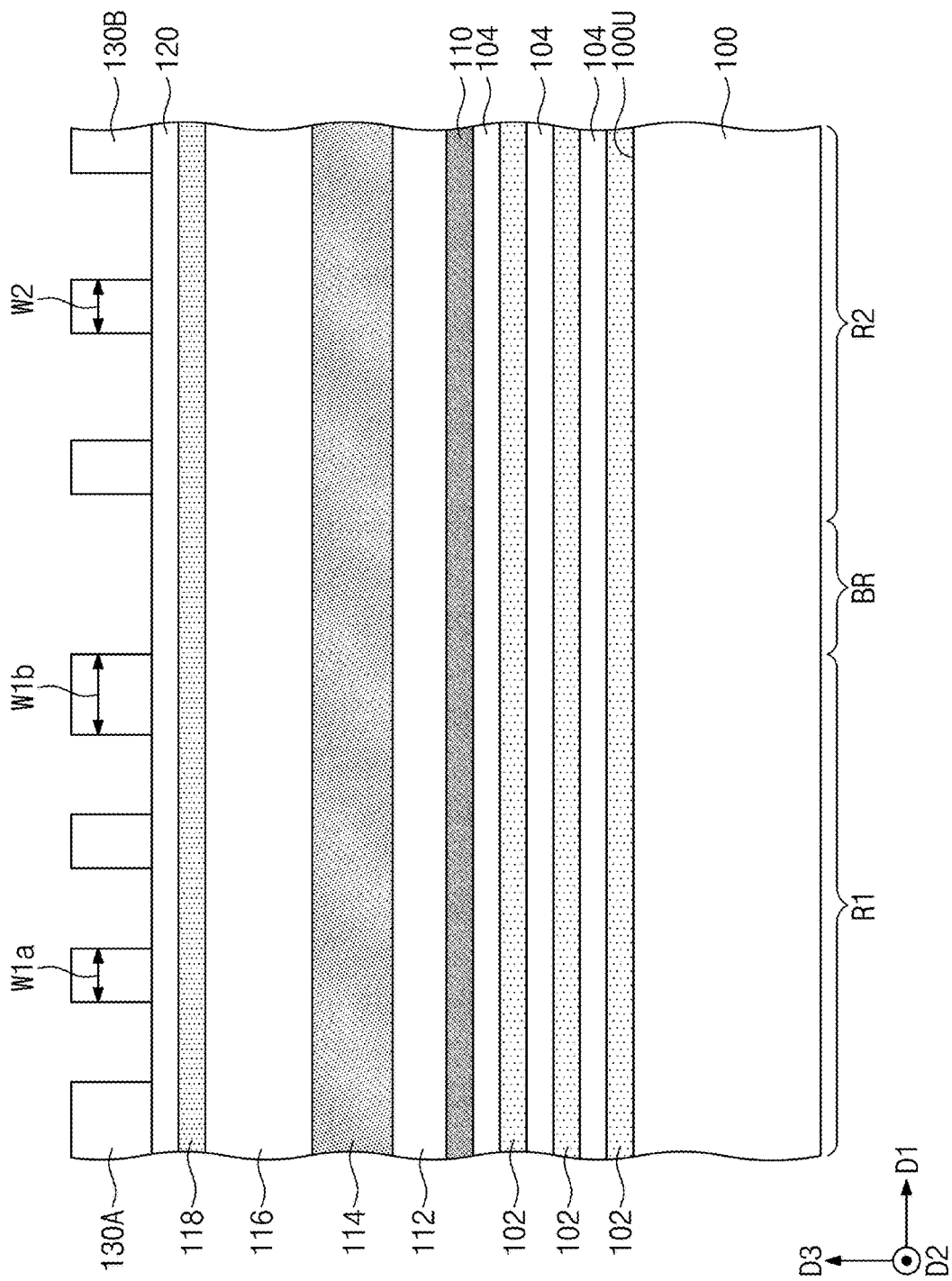
FIGS. 1 to 11 are cross-sectional views illustrating a method of manufacturing a semiconductor device according to some embodiments of inventive concepts.

Referring to FIG. 1, a substrate 100 may be provided. The substrate 100 may be a semiconductor substrate, for example, a silicon substrate, a germanium substrate, or a silicon-germanium substrate. The substrate 100 may include a first region R1, a second region R2, and a boundary region BR provided therebetween. The first region R1 may be a region of the substrate 100, in which first active patterns having various widths or pitches will be formed. The second region R2 may be another region of the substrate 100, in which second active patterns having a relatively narrow width or pitch will be formed. The boundary region BR may be still another region of the substrate 100, which is disposed between the first region R1 and the second region R2.

Sacrificial layers 102 and semiconductor layers 104 may be alternately and repeatedly stacked on the substrate 100. The sacrificial layers 102 and the semiconductor layers 104 may be stacked on the first region R1 of the substrate 100 and may extend onto the boundary region BR and the second region R2. The sacrificial layers 102 and the semiconductor layers 104 are repeatedly stacked three times in FIG. 1. However, embodiments of inventive concepts are not limited thereto. A lowermost one of the sacrificial layers 102 may be disposed between the substrate 100 and a lowermost one of the semiconductor layers 104. The sacrificial layers 102 may include a material having an etch selectivity with respect to the semiconductor layers 104. The sacrificial layers 102 may include at least one of silicon (Si), silicon-germanium (SiGe), or germanium (Ge). The semiconductor layers 104 may include at least one of silicon (Si), silicon-germanium (SiGe) or germanium (Ge), which is different from that of the sacrificial layers 102. For example, the sacrificial layers 102 may include silicon-germanium (SiGe), and the semiconductor layers 104 may include silicon (Si). The sacrificial layers 102 and the semiconductor layers 104 may be formed by performing an epitaxial growth process using the substrate 100 as a seed. Thicknesses of the sacrificial layers 102 may be equal to or different from thicknesses of the semiconductor layers 104.

A lower mask layer 110 may be formed on an uppermost one of the semiconductor layers 104. The lower mask layer 110 may include, for example, silicon nitride. The lower mask layer 110 may be formed to cover the first region R1, the boundary region BR and the second region R2 of the substrate 100.

A sub-lower mask layer 112, an intermediate mask layer 114 and a sub-upper mask layer 116 may be sequentially stacked on the lower mask layer 110. Each of the sub-lower mask layer 112, the intermediate mask layer 114 and the sub-upper mask layer 116 may be formed to cover the first region R1, the boundary region BR and the second region R2 of the substrate 100. The sub-lower mask layer 112 may include an oxide (e.g., silicon oxide). The intermediate mask layer 114 may include a material having an etch selectivity with respect to the sub-lower mask layer 112. For example, the intermediate mask layer 114 may include poly-crystalline silicon (e.g., poly-silicon). The sub-upper mask layer 116 may include a material having an etch selectivity with respect to the intermediate mask layer 114 and may include, for example, an amorphous carbon layer (ACL).

An upper mask layer 118 and an underlayer 120 may be sequentially stacked on the sub-upper mask layer 116. Each of the upper mask layer 118 and the underlayer 120 may be formed to cover the first region R1, the boundary region BR and the second region R2 of the substrate 100. The upper mask layer 118 may include, for example, silicon oxynitride. The underlayer 120 may include a material capable of increasing adhesion of photoresist patterns to be formed thereon.

Photoresist patterns 130A and 130B may be formed on the underlayer 120. The photoresist patterns 130A and 130B may include first photoresist patterns 130A formed on the first region R1 of the substrate 100, and second photoresist patterns 130B formed on the second region R2 of the substrate 100. The first and second photoresist patterns 130A and 130B may be formed at the same time by a single exposure process using a single photomask. For example, the first and second photoresist patterns 130A and 130B may be formed at the same time by an extreme ultraviolet (EUV) exposure process using a single photomask. In the present specification, extreme ultraviolet (EUV) light may mean ultraviolet light having a wavelength of 4 nm to 124 nm (for example, a wavelength of 4 nm to 20 nm, and for example, a wavelength of 13.5 nm). The extreme ultraviolet (EUV) light may mean light having an energy of 6.21 eV to 124 eV (for example, an energy of 90 eV to 95 eV).

For example, the first and second photoresist patterns 130A and 130B may include an organic photoresist containing an organic polymer such as polyhydroxystyrene. The organic photoresist may further include a photosensitive compound capable of reacting to extreme ultraviolet (EUV) light. The organic photoresist may additionally include a material having a high absorption rate for the EUV light, for example, an organometallic material, an iodine-containing material, or a fluorine-containing material. For other examples, the first and second photoresist patterns 130A and 130B may include an inorganic photoresist containing an inorganic material such as tin oxide.

For example, the first photoresist patterns 130A may be spaced apart from each other in a first direction D1 parallel to a top surface 100U of the substrate 100 and may extend long in a second direction D2 which is parallel to the top surface 100U of the substrate 100 and intersects the first direction D1. The first photoresist patterns 130A may be formed to have various widths or pitches. For example, the first photoresist patterns 130A may have widths W1$a$ and W1$b$ in the first direction D1, and a width W1$a$ of at least one of the first photoresist patterns 130A may be different from a width W1$b$ of another of the first photoresist patterns 130A. For example, the first photoresist patterns 130A may be formed to have various widths W1$a$ and W1$b$ in a range from about 15 nm to about 45 nm.

For example, the second photoresist patterns 130B may be spaced apart from each other in the first direction D1 and may extend long in the second direction D2. The second photoresist patterns 130B may be formed to have a constant width or pitch. For example, the second photoresist patterns 130B may have widths W2 in the first direction D1, and the widths W2 of the second photoresist patterns 130B may be equal to each other. A minimum pitch of the second photoresist patterns 130B may be, for example, about 45 nm or less.

Figure 2:
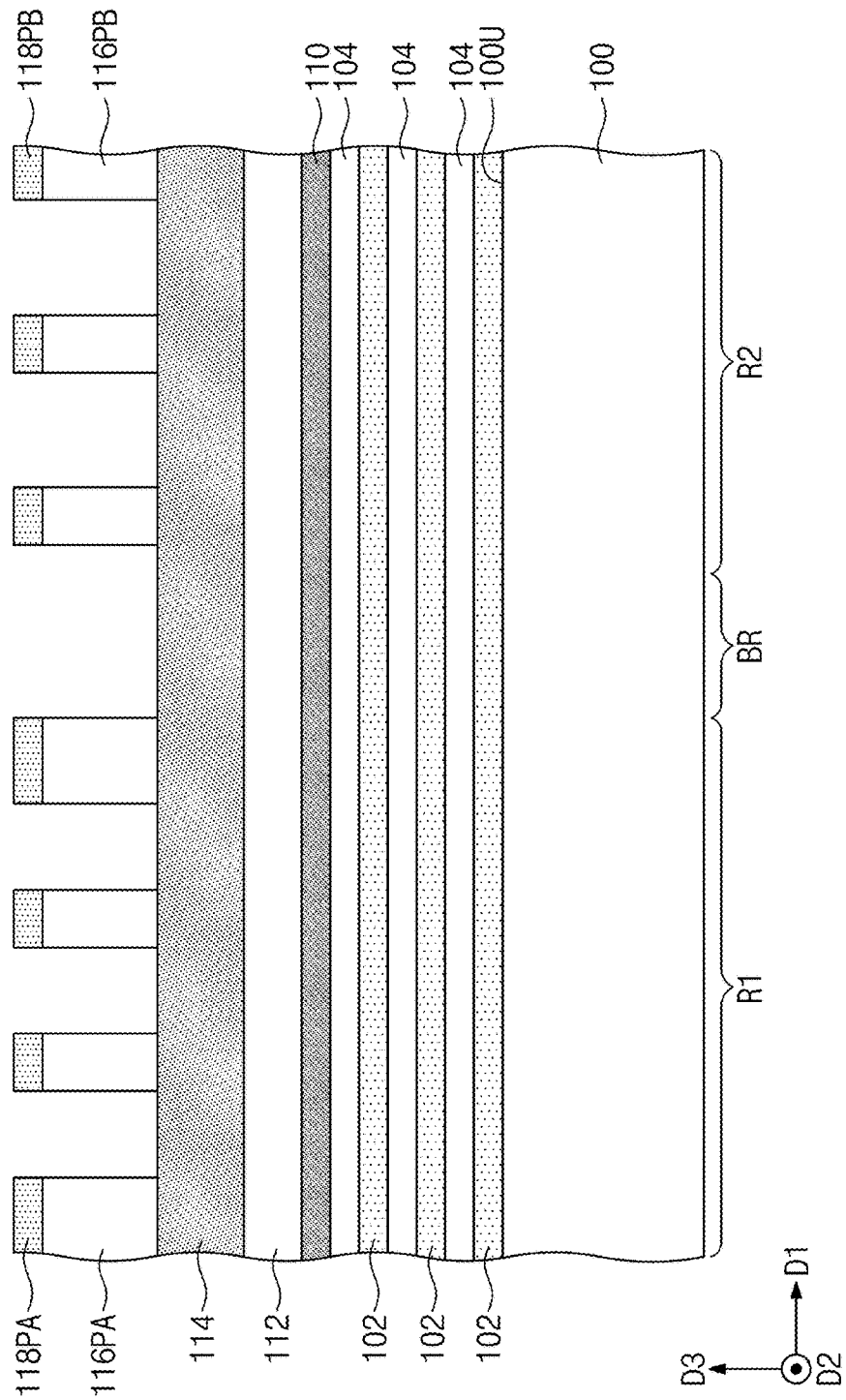

Referring to FIG. 2, the upper mask layer 118 and the sub-upper mask layer 116 may be etched using the photoresist patterns 130A and 130B as etch masks. Upper mask patterns 118PA and 118PB and sub-upper mask patterns 116PA and 116PB may be formed on the intermediate mask layer 114 by the etching of the upper mask layer 118 and the sub-upper mask layer 116. The upper mask patterns 118PA and 118PB may be spaced apart from each other in the first direction D1 and may extend long in the second direction D2. The sub-upper mask patterns 116PA and 116PB may be spaced apart from each other in the first direction D1 and may extend long in the second direction D2.

The upper mask patterns 118PA and 118PB may include first upper mask patterns 118PA on the first region R1 of the substrate 100, and second upper mask patterns 118PB on the second region R2 of the substrate 100. The sub-upper mask patterns 116PA and 116PB may include first sub-upper mask patterns 116PA on the first region R1 of the substrate 100, and second sub-upper mask patterns 116PB on the second region R2 of the substrate 100. The first upper mask patterns 118PA and the first sub-upper mask patterns 116PA may be formed using the first photoresist patterns 130A as etch masks, and the second upper mask patterns 118PB and the second sub-upper mask patterns 116PB may be formed using the second photoresist patterns 130B as etch masks.

After the formation of the upper mask patterns 118PA and 118PB and the sub-upper mask patterns 116PA and 116PB, the photoresist patterns 130A and 130B and the underlayer 120 may be removed by, for example, an ashing process and/or a strip process.

Figure 3:
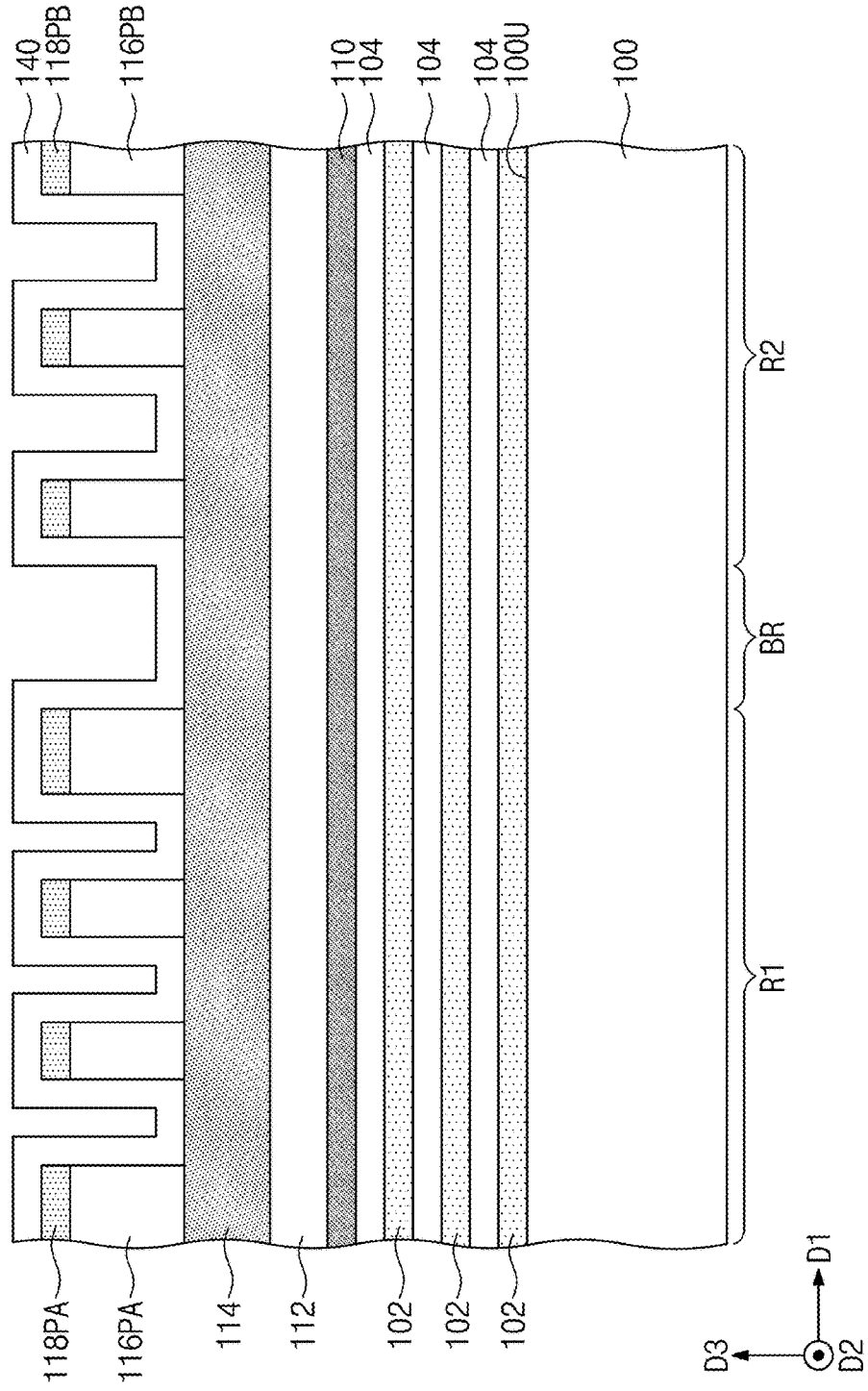

Referring to FIG. 3, a spacer layer 140 may be formed on the intermediate mask layer 114 and may conformally cover the upper mask patterns 118PA and 118PB and the sub-upper mask patterns 116PA and 116PB. The spacer layer 140 may include an oxide (e.g., silicon oxide).

Figure 4:
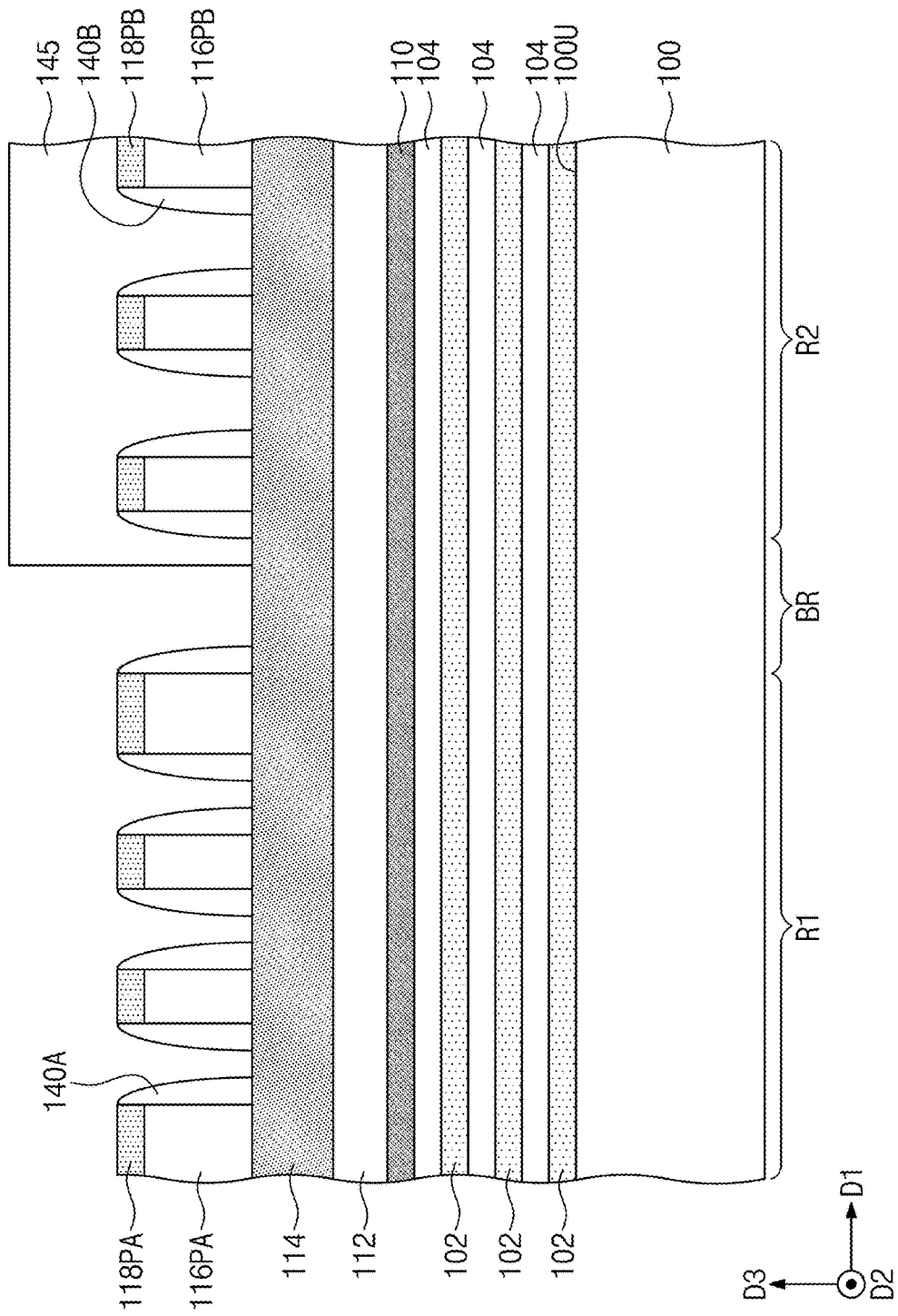

Referring to FIG. 4, spacer patterns 140A and 140B may be formed on sidewalls of the upper mask patterns 118PA and 118PB and the sub-upper mask patterns 116PA and 116PB. The spacer patterns 140A and 140B may be formed by anisotropically etching the spacer layer 140.

The spacer patterns 140A and 140B may include first spacer patterns 140A on the sidewalls of the first upper mask patterns 118PA and the first sub-upper mask patterns 116PA, and second spacer patterns 140B on the sidewalls of the second upper mask patterns 118PB and the second sub-upper mask patterns 116PB. Each of the first spacer patterns 140A may cover the sidewall of a corresponding one of the first sub-upper mask patterns 116PA and may extend onto the sidewall of a corresponding one of the first upper mask patterns 118PA. Each of the second spacer patterns 140B may cover the sidewall of a corresponding one of the second sub-upper mask patterns 116PB and may extend onto the sidewall of a corresponding one of the second upper mask patterns 118PB. The first spacer patterns 140A may be spaced apart from each other in the first direction D1 and may extend long in the second direction D2 along the sidewalls of the first upper mask patterns 118PA and the first sub-upper mask patterns 116PA. The second spacer patterns 140B may be spaced apart from each other in the first direction D1 and may extend long in the second direction D2 along the sidewalls of the second upper mask patterns 118PB and the second sub-upper mask patterns 116PB.

After the formation of the spacer patterns 140A and 140B, a first mask pattern 145 may be formed to cover the second region R2 of the substrate 100. The first mask pattern 145 may cover the second upper mask patterns 118PB, the second sub-upper mask patterns 116PB and the second spacer patterns 140B on the second region R2 and may cover a top surface of the intermediate mask layer 114 on the second region R2. The first mask pattern 145 may expose the first region R1 and the boundary region BR of the substrate 100. The first mask pattern 145 may expose the first upper mask patterns 118PA, the first sub-upper mask patterns 116PA and the first spacer patterns 140A on the first region R1 and may expose the top surface of the intermediate mask layer 114 on the boundary region BR. The first mask pattern 145 may include, for example, a photoresist material.

Figure 5:
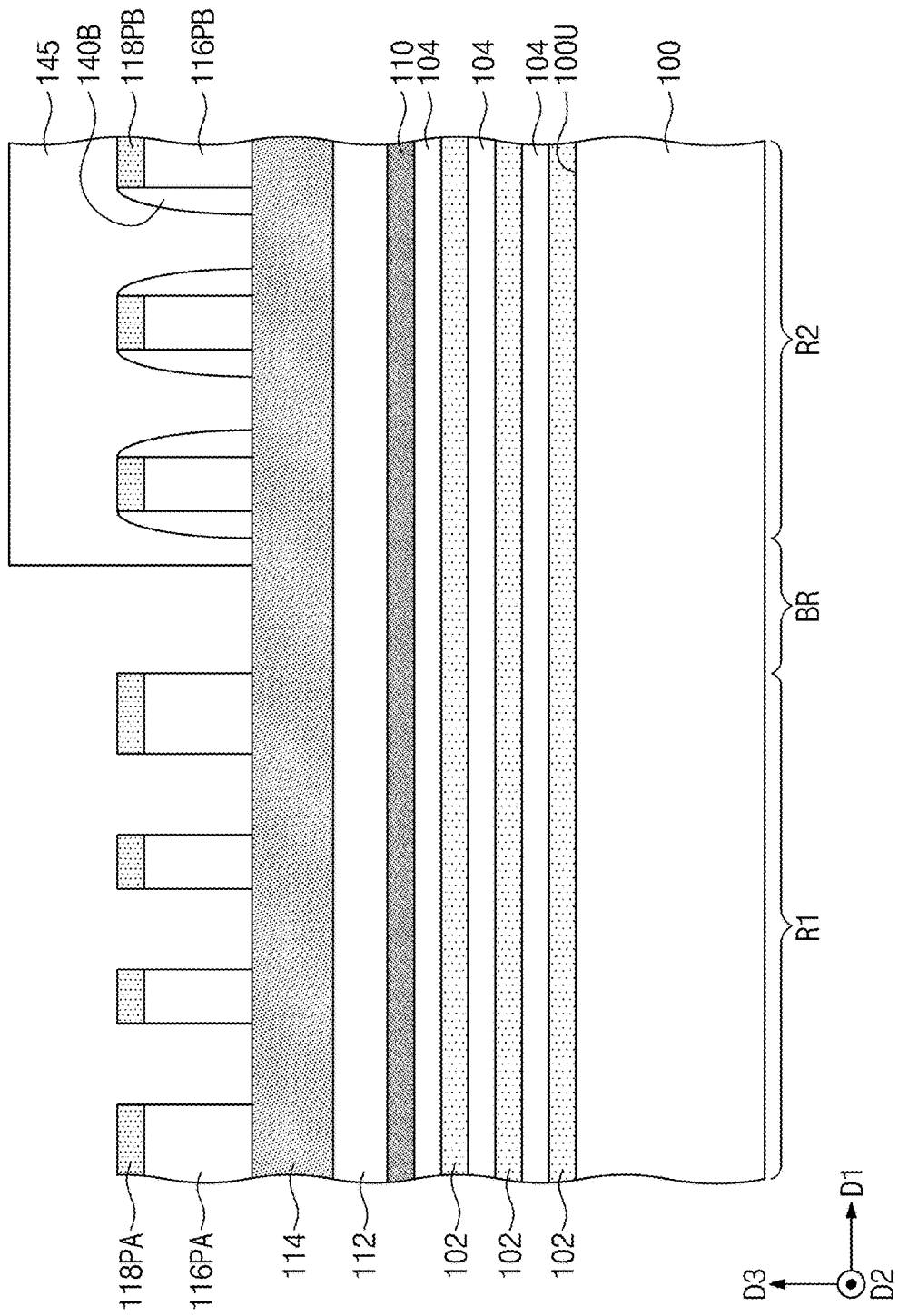

Referring to FIG. 5, the first spacer patterns 140A exposed by the first mask pattern 145 may be selectively removed. For example, the first spacer patterns 140A may be removed by performing an etching process (e.g., a wet etching process) having an etch selectivity with respect to the first mask pattern 145, the first upper mask patterns 118PA, the first sub-upper mask patterns 116PA, and the intermediate mask layer 114.

Figure 6:
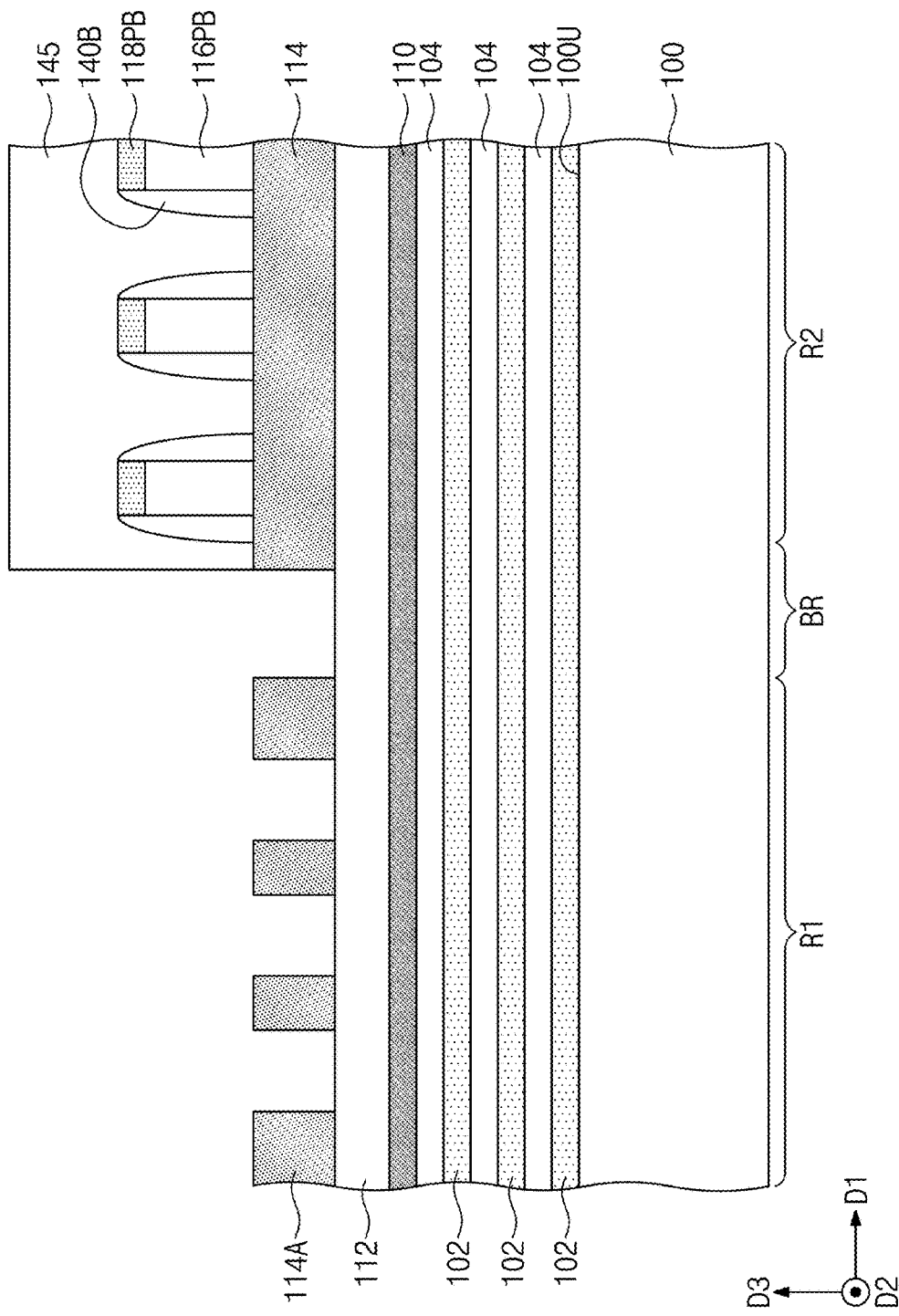

Referring to FIG. 6, the intermediate mask layer 114 may be etched using the first mask pattern 145, the first upper mask patterns 118PA and the first sub-upper mask patterns 116PA as etch masks. The intermediate mask layer 114 on the first region R1 may be etched using the first upper mask patterns 118PA and the first sub-upper mask patterns 116PA as etch masks, and thus first intermediate mask patterns 114A may be formed on the sub-lower mask layer 112 provided on the first region R1. The first intermediate mask patterns 114A may be spaced apart from each other in the first direction D1 and may extend long in the second direction D2. A remaining portion of the intermediate mask layer 114, which is covered by the first mask pattern 145, may not be etched but may remain on the sub-lower mask layer 112 provided on the second region R2.

The first upper mask patterns 118PA and the first sub-upper mask patterns 116PA on the first region R1 may be removed after the formation of the first intermediate mask patterns 114A. For example, the first upper mask patterns 118PA and the first sub-upper mask patterns 116PA may be removed by performing an etching process having an etch selectivity with respect to the first mask pattern 145, the first intermediate mask patterns 114A, the remaining portion of the intermediate mask layer 114, and the sub-lower mask layer 112.

Figure 7:
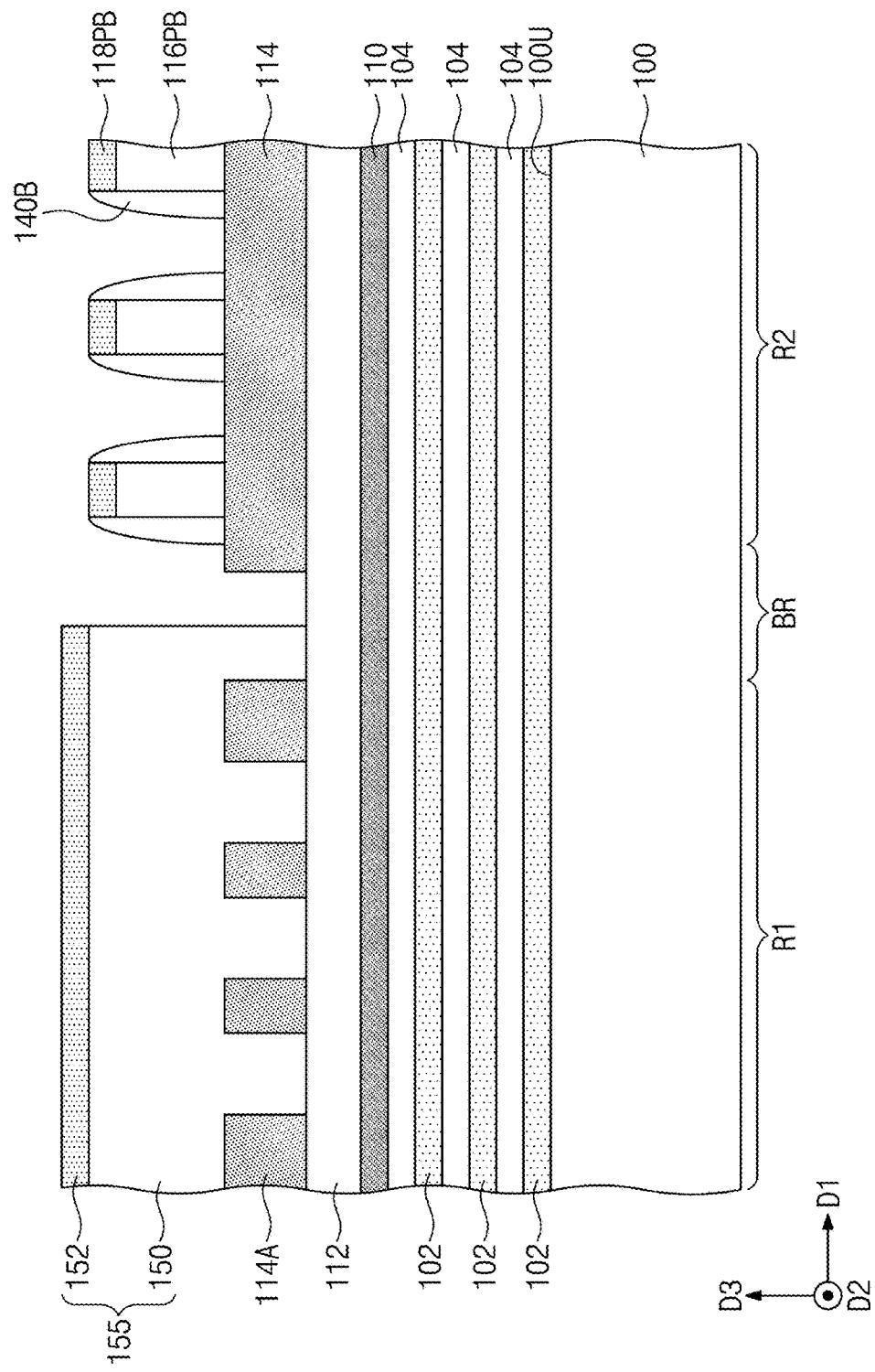

Referring to FIG. 7, the first mask pattern 145 may be removed by performing, for example, an ashing process and/or a strip process. A second mask pattern 155 may be formed on the first region R1 of the substrate 100. The second mask pattern 155 may cover the first intermediate mask patterns 114A on the first region R1 and may cover a portion of a top surface of the sub-lower mask layer 112 on the boundary region BR. The second mask pattern 155 may expose the second upper mask patterns 118PB, the second sub-upper mask patterns 116PB, the second spacer patterns 140B and the remaining portion of the intermediate mask layer 114 on the second region R2 and may expose another portion of the top surface of the sub-lower mask layer 112 on the boundary region BR.

The second mask pattern 155 may include a lower hard mask pattern 150 covering the first intermediate mask patterns 114A on the first region R1, and an upper hard mask pattern 152 on the lower hard mask pattern 150. The lower hard mask pattern 150 may include, for example, a spin-on-hardmask (SOH) material, and the upper hard mask pattern 152 may include, for example, silicon oxynitride.

Figure 8:
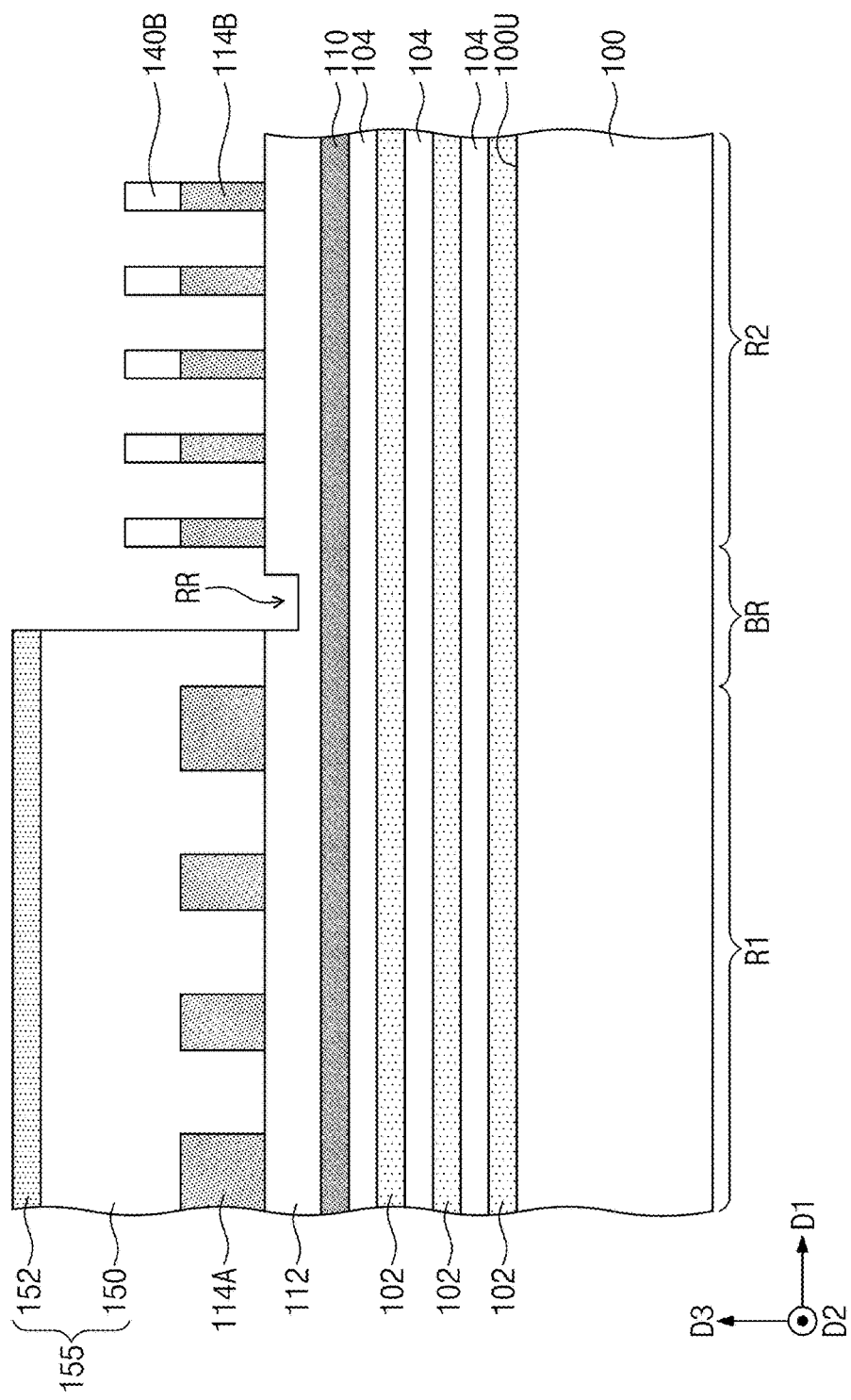

Referring to FIG. 8, the second upper mask patterns 118PB and the second sub-upper mask patterns 116PB on the second region R2 may be selectively removed. For example, the second upper mask patterns 118PB and the second sub-upper mask patterns 116PB may be removed by selectively etching the second upper mask patterns 118PB and the second sub-upper mask patterns 116PB while leaving the second mask pattern 155, the second spacer patterns 140B, the remaining portion of the intermediate mask layer 114, and the sub-lower mask layer 112.

After the removal of the second upper mask patterns 118PB and the second sub-upper mask patterns 116PB, an etching process may be performed using the second mask pattern 155 and the second spacer patterns 140B as etch masks. The remaining portion of the intermediate mask layer 114 on the second region R2 may be etched using the second spacer patterns 140B as etch masks during the etching process, and thus second intermediate mask patterns 114B may be formed on the second region R2. The second intermediate mask patterns 114B may be spaced apart from each other in the first direction D1 and may extend long in the second direction D2.

Upper portions of the second spacer patterns 140B may be etched during the etching process. In addition, the portion of the top surface of the sub-lower mask layer 112 on the boundary region BR, which is exposed by the second mask pattern 155, may be recessed during the etching process. Thus, a recess region RR may be formed in the sub-lower mask layer 112 on the boundary region BR. The recess region RR may be formed by the recessing of the portion of the top surface of the sub-lower mask layer 112 on the boundary region BR, which is exposed between the second mask pattern 155 on the first region R1 and the remaining portion of the intermediate mask layer 114 on the second region R2. The second mask pattern 155 on the first region R1 and the remaining portion of the intermediate mask layer 114 on the second region R2 may extend in the second direction D2, and thus the recess region RR may have a line shape extending long in the second direction D2.

Figure 9:
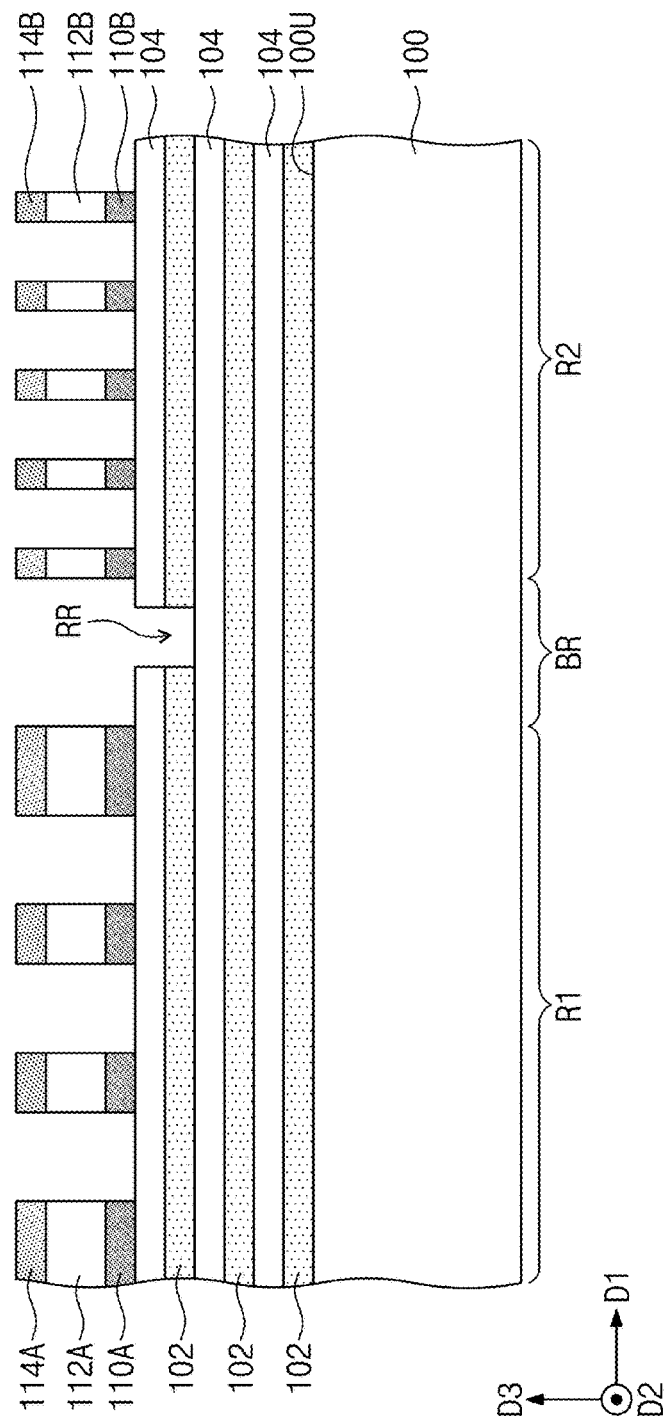

Referring to FIG. 9, the second mask pattern 155 may be removed by, for example, an ashing process and/or a strip process. Thereafter, the sub-lower mask layer 112 and the lower mask layer 110 may be etched using the first and second intermediate mask patterns 114A and 114B and remaining portions of the second spacer patterns 140B as etch masks. Sub-lower mask patterns 112A and 112B and lower mask patterns 110A and 110B may be formed on the uppermost semiconductor layer 104 by the etching of the sub-lower mask layer 112 and the lower mask layer 110. During the etching process for the formation of the sub-lower mask patterns 112A and 112B and the lower mask patterns 110A and 110B, the remaining portions of the second spacer patterns 140B may be removed and upper portions of the first and second intermediate mask patterns 114A and 114B may be removed. The sub-lower mask patterns 112A and 112B may be spaced apart from each other in the first direction D1 and may extend long in the second direction D2. The lower mask patterns 110A and 110B may be spaced apart from each other in the first direction D1 and may extend long in the second direction D2.

The sub-lower mask patterns 112A and 112B may include first sub-lower mask patterns 112A on the first region R1, and second sub-lower mask patterns 112B on the second region R2. The lower mask patterns 110A and 110B may include first lower mask patterns 110A on the first region R1, and second lower mask patterns 110B on the second region R2. During the etching process for the formation of the sub-lower mask patterns 112A and 112B and the lower mask patterns 110A and 110B, the recess region RR may be transferred into a stack layer including the semiconductor layers 104 and the sacrificial layers 102, and thus the recess region RR may be formed in at least a portion of the semiconductor layers 104 and the sacrificial layers 102 on the boundary region BR.

Figure 10:
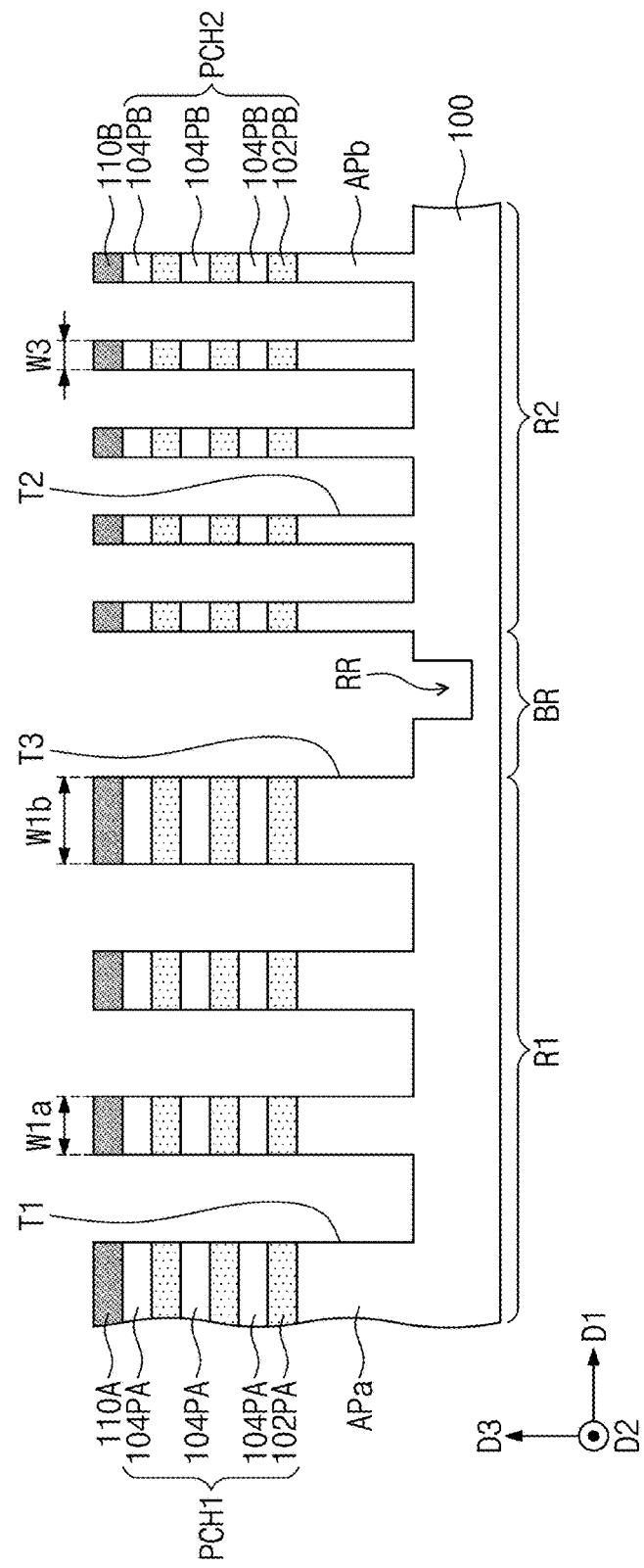

Referring to FIG. 10, the semiconductor layers 104, the sacrificial layers 102 and an upper portion of the substrate 100 may be etched using remaining portions of the intermediate mask patterns 114A and 114B, the sub-lower mask patterns 112A and 112B and the lower mask patterns 110A and 110B as etch masks.

Preliminary channel patterns PCH1 and PCH2 may be formed on the substrate 100 by the etching of the semiconductor layers 104 and the sacrificial layers 102. The preliminary channel patterns PCH1 and PCH2 may be spaced apart from each other in the first direction D1 and may extend long in the second direction D2. The preliminary channel patterns PCH1 and PCH2 may include first preliminary channel patterns PCH1 on the first region R1, and second preliminary channel patterns PCH2 on the second region R2. Each of the first preliminary channel patterns PCH1 may include first sacrificial patterns 102PA and first semiconductor patterns 104PA which are alternately stacked on the first region R1 of the substrate 100, and each of the second preliminary channel patterns PCH2 may include second sacrificial patterns 102PB and second semiconductor patterns 104PB which are alternately stacked on the second region R2 of the substrate 100. The first and second sacrificial patterns 102PA and 102PB and the first and second semiconductor patterns 104PA and 104PB may be formed by etching the sacrificial layers 102 and the semiconductor layers 104 using the remaining portions of the intermediate mask patterns 114A and 114B, the sub-lower mask patterns 112A and 112B and the lower mask patterns 110A and 110B as etch masks.

Since the upper portion of the substrate 100 is etched, trenches T1, T2 and T3 defining active patterns APa and APb may be formed in the substrate 100. The active patterns APa and APb may be spaced apart from each other in the first direction D1 and may extend long in the second direction D2. The trenches T1, T2 and T3 may include first trenches T1 formed in the first region R1 of the substrate 100 to define first active patterns APa, second trenches T2 formed in the second region R2 of the substrate 100 to define second active patterns APb, and a third trench T3 formed in the boundary region BR of the substrate 100. The first preliminary channel patterns PCH1 may be formed on the first active patterns APa, respectively, and the second preliminary channel patterns PCH2 may be formed on the second active patterns APb, respectively.

The first preliminary channel patterns PCH1 and the first active patterns APa may be formed to have widths (or pitches) corresponding to those of the first photoresist patterns 130A described with reference to FIG. 1. For example, the first preliminary channel patterns PCH1 may be spaced apart from each other in the first direction D1 and may extend long in the second direction D2. The first preliminary channel patterns PCH1 may be formed to have various widths or pitches. The first preliminary channel patterns PCH1 may have widths W1a and W1b in the first direction D1, and a width W1a of at least one of the first preliminary channel patterns PCH1 may be different from a width W1b of another of the first preliminary channel patterns PCH1. For example, the first active patterns APa may be spaced apart from each other in the first direction D1 and may extend long in the second direction D2. The first active patterns APa may be formed to have various widths or pitches. The first active patterns APa may have widths W1*a* and W1*b* in the first direction D1, and a width W1*a* of at least one of the first active patterns APa may be different from a width W1*b* of another of the first active patterns APa.

The second preliminary channel patterns PCH2 and the second active patterns APb may be formed to have widths (or pitches) different from that of the second photoresist patterns 130B described with reference to FIG. 1. The second preliminary channel patterns PCH2 and the second active patterns APb may be formed to have widths (or pitches) corresponding to that of the second spacer patterns 140B described with reference to FIG. 4. For example, the second preliminary channel patterns PCH2 may be spaced apart from each other in the first direction D1 and may extend long in the second direction D2. The second preliminary channel patterns PCH2 may be formed to have a constant width or pitch. The second preliminary channel patterns PCH2 may have widths W3 in the first direction D1, and the widths W3 of the second preliminary channel patterns PCH2 may be equal to each other. The widths W3 of the second preliminary channel patterns PCH2 may be less than the widths W2 of the second photoresist patterns 130B. The widths W3 of the second preliminary channel patterns PCH2 may be less than the widths W1*a* or W1*b* of at least some of the first preliminary channel patterns PCH1. For example, the second active patterns APb may be spaced apart from each other in the first direction D1 and may extend long in the second direction D2. The second active patterns APb may be formed to have a constant width or pitch. The second active patterns APb may have widths W3 in the first direction D1, and the widths W3 of the second active patterns APb may be equal to each other. The widths W3 of the second active patterns APb may be less than the widths W2 of the second photoresist patterns 130B. The widths W3 of the second active patterns APb may be less than the widths W1*a* or W1*b* of at least some of the first active patterns APa.

The third trench T3 may be formed between a corresponding one of the first active patterns APa and a corresponding one of the second active patterns APb. The third trench T3 may expose a sidewall of the corresponding first active pattern APa and a sidewall of the corresponding second active pattern APb. A bottom surface of the third trench T3 may expose the substrate 100 of the boundary region BR. During the etching process for the formation of the first and second preliminary channel patterns PCH1 and PCH2 and the first and second active patterns APa and APb, the recess region RR may be transferred into the substrate 100, and thus the recess region RR may be formed in the substrate 100 of the boundary region BR. The recess region RR may be formed in the substrate 100 exposed by the bottom surface of the third trench T3. The recess region RR may have a line shape extending long in the second direction D2, as described with reference to FIG. 8.

The remaining portions of the intermediate mask patterns 114A and 114B and the sub-lower mask patterns 112A and 112B may be removed during the etching process for the formation of the preliminary channel patterns PCH1 and PCH2 and the active patterns APa and APb.

Figure 11:
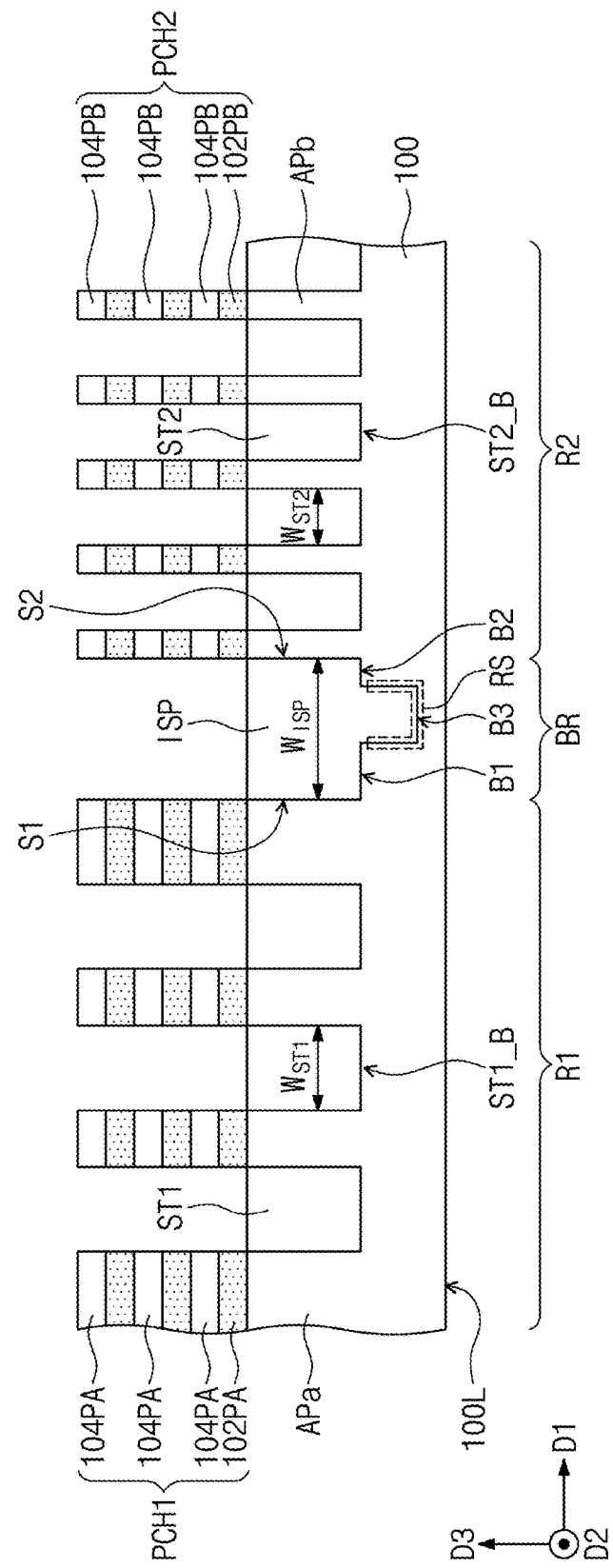

Referring to FIG. 11, first device isolation patterns ST1, second device isolation patterns ST2 and an isolation insulating pattern ISP may be formed in the first trenches T1, the second trenches T2 and the third trench T3, respectively. The isolation insulating pattern ISP may be formed to fill the recess region RR. For example, the formation of the first device isolation patterns ST1, the second device isolation patterns ST2 and the isolation insulating pattern ISP may include forming a device isolation layer covering the preliminary channel patterns PCH1 and PCH2 and the active patterns APa and APb and filling the first to third trenches T1, T2 and T3 on the substrate 100, and etching the device isolation layer to expose top surfaces and sidewalls of the preliminary channel patterns PCH1 and PCH2. Thus, the first device isolation patterns ST1, the second device isolation patterns ST2 and the isolation insulating pattern ISP may be locally formed in the first trenches T1, the second trenches T2 and the third trench T3, respectively. For example, the lower mask patterns 110A and 110B may be removed when the device isolation layer is etched.

The first device isolation patterns ST1 may be disposed between the first active patterns APa on the first region R1, and the second device isolation patterns ST2 may be disposed between the second active patterns APb on the second region R2. The isolation insulating pattern ISP may be disposed on the boundary region BR between the first active patterns APa and the second active patterns APb. The isolation insulating pattern ISP may be disposed between a corresponding one of the first active patterns APa and a corresponding one of the second active patterns APb. A first sidewall S1 of the isolation insulating pattern ISP may be in contact with a sidewall of the corresponding first active pattern APa, and a second sidewall S2 of the isolation insulating pattern ISP may be in contact with a sidewall of the corresponding second active pattern APb. A bottom surface B1, B2 and B3 of the isolation insulating pattern ISP may be in contact with the substrate 100 between the first sidewall S1 and the second sidewall S2.

The bottom surface B1, B2 and B3 of the isolation insulating pattern ISP may include a first bottom surface B1 adjacent to the corresponding first active pattern APa, a second bottom surface B2 adjacent to the corresponding second active pattern APb, and a third bottom surface B3 between the first bottom surface B1 and the second bottom surface B2. The third bottom surface B3 of the isolation insulating pattern ISP may be located at a different height from those of the first and second bottom surfaces B1 and B2 with respect to a bottom surface 100L of the substrate 100.

In some embodiments, the isolation insulating pattern ISP may be formed to fill the recess region RR, and thus the bottom surface of the isolation insulating pattern ISP may include a recess surface RS recessed from the first and second bottom surfaces B1 and B2 into the substrate 100. In this case, the recess surface RS may include the third bottom surface B3, and the third bottom surface B3 may be located at a lower height than the first and second bottom surfaces B1 and B2 with respect to the bottom surface 100L of the substrate 100. In some embodiments, the third bottom surface B3 of the isolation insulating pattern ISP may be located at a lower height than bottom surfaces ST1_B of the first device isolation patterns ST1 and bottom surfaces ST2_B of the second device isolation patterns ST2 with respect to the bottom surface 100L of the substrate 100. In some embodiments, the first bottom surface B1 of the isolation insulating pattern ISP may be located at substantially the same height as or a lower height than the bottom surfaces ST1_B of the first device isolation patterns ST1 with respect to the bottom surface 100L of the substrate 100, and the second bottom surface B2 of the isolation insulating pattern ISP may be located at substantially the same height as or a lower height than the bottom surfaces ST2_B of the second device isolation patterns ST2 with respect to the bottom surface 100L of the substrate 100.

In some embodiments, the recess surface RS of the isolation insulating pattern ISP may be disposed to be closer to the sidewall of the corresponding second active pattern APb than to the sidewall of the corresponding first active pattern APa. In this case, a length, in the first direction D1, of the second bottom surface B2 of the isolation insulating pattern ISP may be less than a length, in the first direction D1, of the first bottom surface B1 of the isolation insulating pattern ISP.

The first device isolation patterns ST1 may have a first width $W_{ST1}$ in the first direction D1, and the second device isolation patterns ST2 may have a second width $W_{ST2}$ in the first direction D1. The isolation insulating pattern ISP may have a third width $W_{ISP}$ in the first direction D1, and the third width $W_{ISP}$ may be greater than the first width $W_{ST1}$ and the second width $W_{ST2}$.

The isolation insulating pattern ISP may extend long in the second direction D2 between the corresponding first active pattern APa and the corresponding second active pattern APb. In other words, the first bottom surface B1 and the second bottom surface B2 of the isolation insulating pattern ISP may extend long in the second direction D2, and the recess surface RS including the third bottom surface B3 may extend long in the second direction D2 between the first bottom surface B1 and the second bottom surface B2.

According to embodiments of inventive concepts, the first photoresist patterns 130A having the various widths or pitches and the second photoresist patterns 130B having the constant width or pitch may be formed at the same time by the single exposure process using the single photomask. The first preliminary channel patterns PCH1 and the first active patterns APa may be formed to have the various widths or pitches corresponding to those of the first photoresist patterns 130A. The second preliminary channel patterns PCH2 and the second active patterns APb may be formed to have the constant widths or pitches (e.g., relatively narrow widths or pitches) corresponding to that of the second spacer patterns 140B formed using the second photoresist patterns 130B. The first preliminary channel patterns PCH1 and the first active patterns APa having the various widths or pitches and the second preliminary channel patterns PCH2 and the second active patterns APb having the relatively narrow widths or pitches may be formed at the same time on the substrate 100, and thus a semiconductor device including the active patterns having various widths or pitches may be easily manufactured.

In addition, the first preliminary channel patterns PCH1, the first active patterns APa, the second preliminary channel patterns PCH2 and the second active patterns APb may be formed using the photoresist patterns 130A and 130B formed by the single exposure process using the single photomask, and thus a manufacturing cost of the semiconductor device may be reduced.

Figure 12:
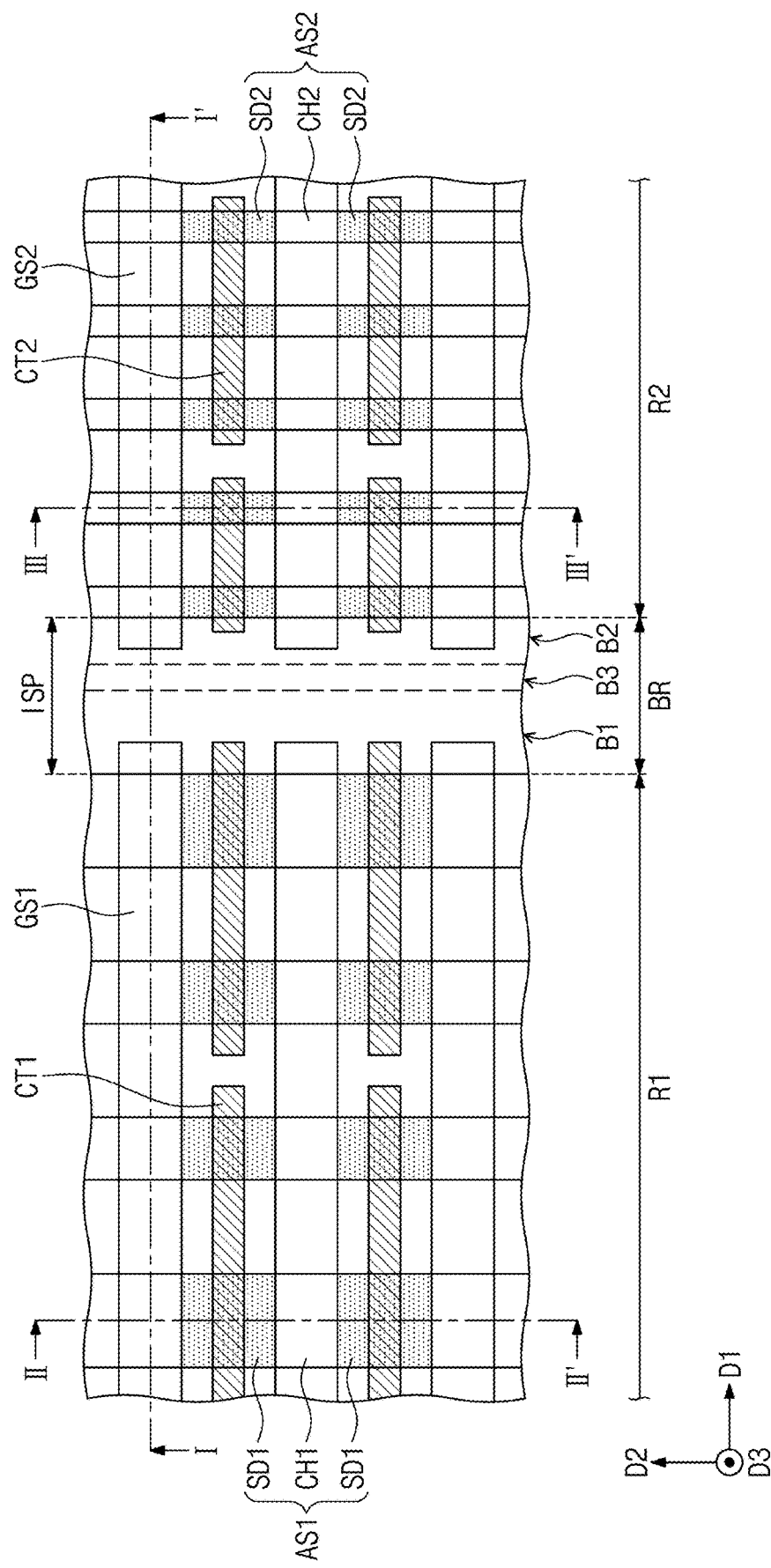
FIG. 12 is a plan view illustrating a semiconductor device according to some embodiments of inventive concepts.
Figure 13:
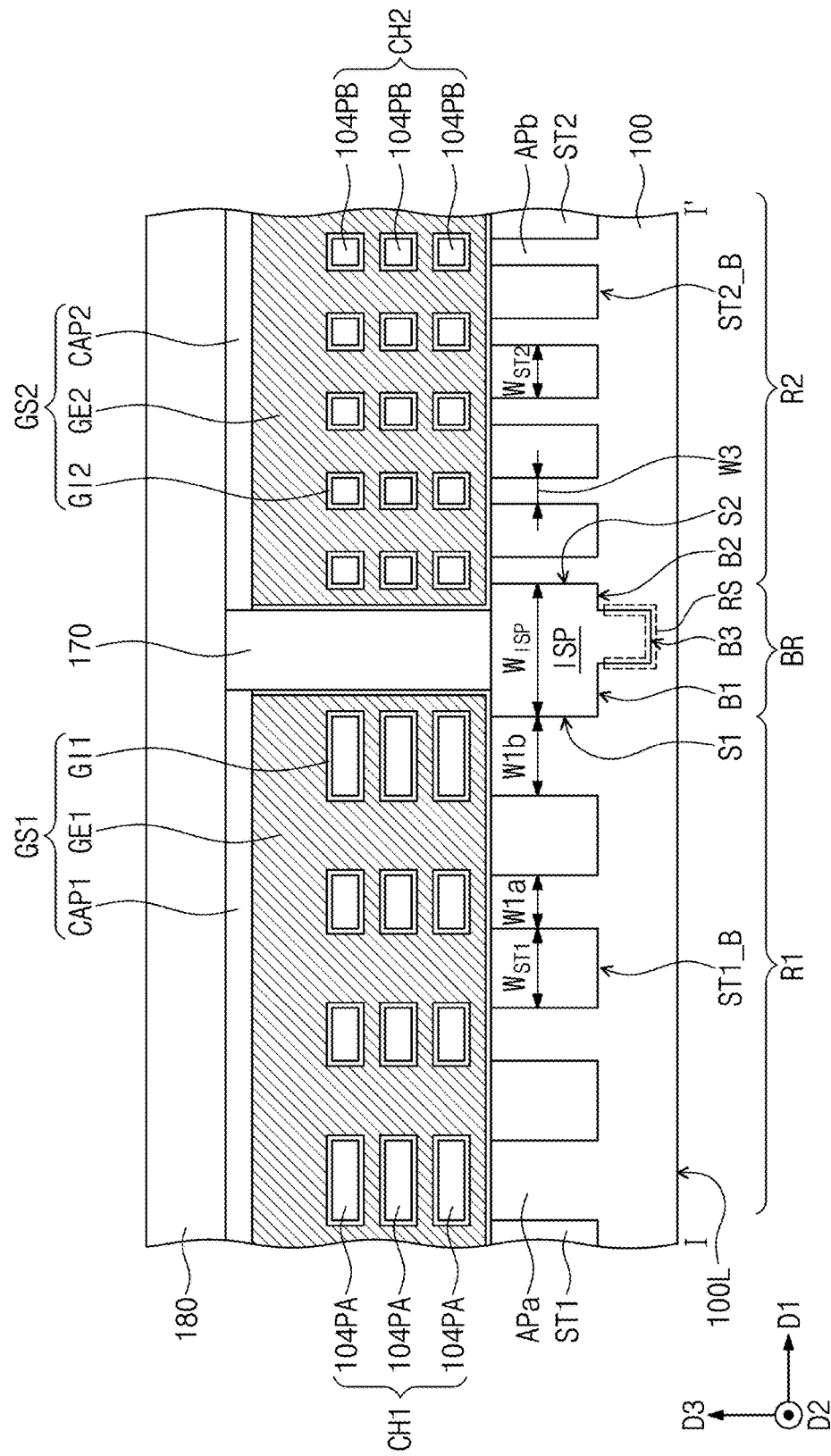
FIG. 13 is a cross-sectional view taken along a line I-I' of FIG. 12.
Figure 14:
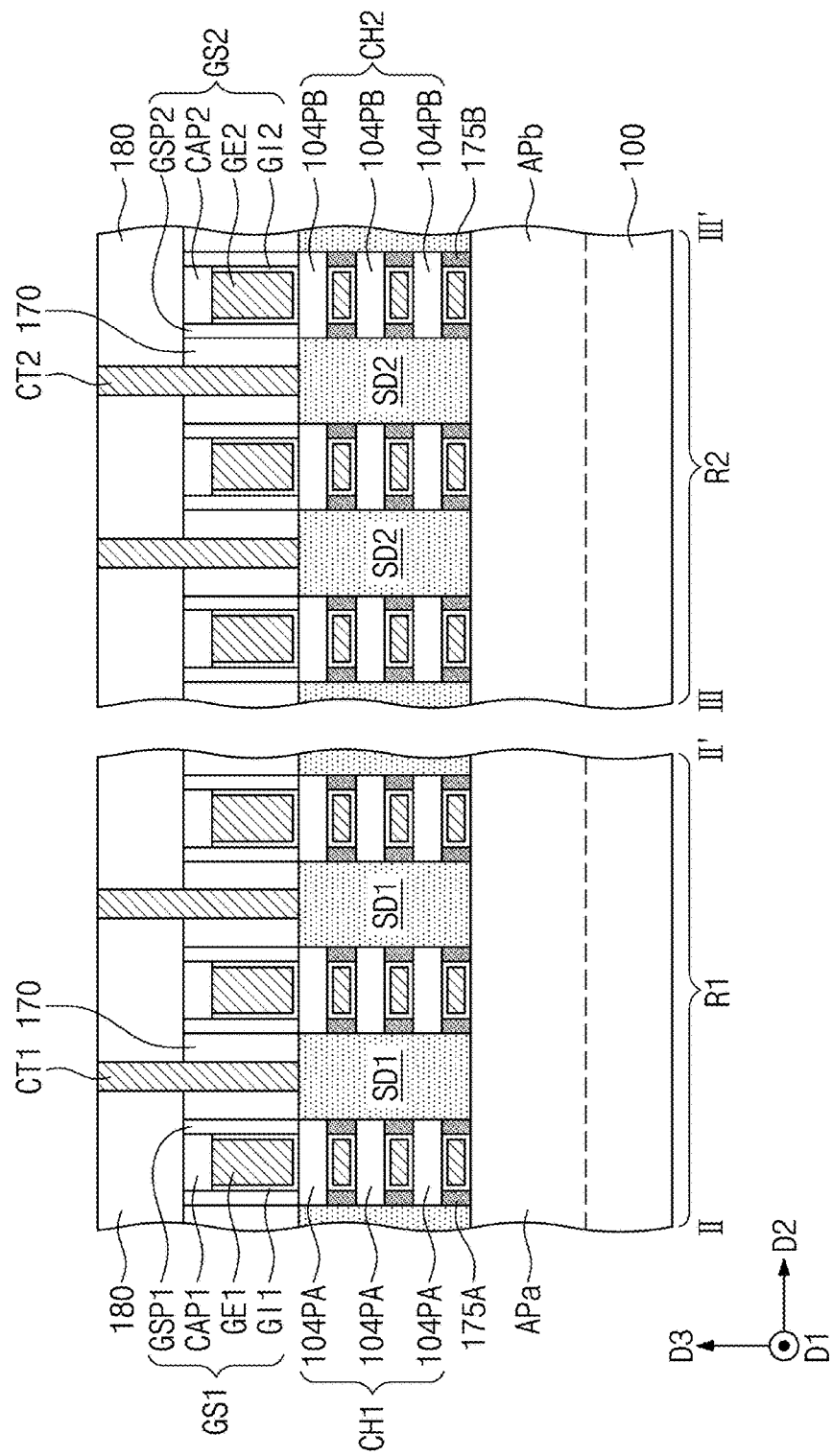
FIG. 14 is a cross-sectional view taken along lines II-II' and III-III' of FIG. 12.

FIG. 12 is a plan view illustrating a semiconductor device according to some embodiments of inventive concepts. FIG. 13 is a cross-sectional view taken along a line I-I' of FIG. 12, and FIG. 14 is a cross-sectional view taken along lines II-II' and III-III' of FIG. 12. Hereinafter, the descriptions to the same technical features as mentioned with reference to FIGS. 1 to 11 will be omitted or mentioned briefly for the purpose of ease and convenience in explanation.

Referring to FIGS. 12 to 14, first device isolation patterns ST1, second device isolation patterns ST2 and an isolation insulating pattern ISP may be disposed in a substrate 100. The first device isolation patterns ST1 may be disposed on a first region R1 of the substrate 100 to define first active patterns APa, and the second device isolation patterns ST2 may be disposed on a second region R2 of the substrate 100 to define second active patterns APb. The isolation insulating pattern ISP may be disposed on a boundary region BR of the substrate 100 between the first active patterns APa and the second active patterns APb. The isolation insulating pattern ISP may be disposed between a corresponding one of the first active patterns APa and a corresponding one of the second active patterns APb.

The first active patterns APa may protrude from the substrate 100 in a third direction D3 perpendicular to a bottom surface 100L of the substrate 100. The first active patterns APa may be spaced apart from each other in the first direction D1 parallel to the bottom surface 100L of the substrate 100 and may extend long in the second direction D2 which is parallel to the bottom surface 100L of the substrate 100 and intersects the first direction D1. Each of the first device isolation patterns ST1 may be disposed between adjacent first active patterns APa of the first active patterns APa and may extend long in the second direction D2 between the adjacent first active patterns APa. The first active patterns APa may have various widths or pitches. For example, the first active patterns APa may have widths W1a and W1b in the first direction D1, and a width W1a of at least one of the first active patterns APa may be different from a width W1b of another of the first active patterns APa.

The second active patterns APb may protrude from the substrate 100 in the third direction D3. The second active patterns APb may be spaced apart from each other in the first direction D1 and may extend long in the second direction D2. Each of the second device isolation patterns ST2 may be disposed between adjacent second active patterns APb of the second active patterns APb and may extend long in the second direction D2 between the adjacent second active patterns APb. The second active patterns APb may have a constant width or pitch. For example, the second active patterns APb may have widths W3 in the first direction D1, and the widths W3 of the second active patterns APb may be equal to each other. The second active patterns APb may have a relatively narrow width or pitch. For example, the widths W3 of the second active patterns APb may be less than the widths W1a or W1b of at least some of the first active patterns APa.

The first device isolation patterns ST1 may have a first width $W_{ST1}$ in the first direction D1, and the second device isolation patterns ST2 may have a second width $W_{ST2}$ in the first direction D1. The isolation insulating pattern ISP may have a third width $W_{ISP}$ in the first direction D1, and the third width $W_{ISP}$ may be greater than the first width $W_{ST1}$ and the second width $W_{ST2}$.

The isolation insulating pattern ISP may be disposed between a corresponding one of the first active patterns APa and a corresponding one of the second active patterns APb. The isolation insulating pattern ISP may extend long in the second direction D2 between the corresponding first active pattern APa and the corresponding second active pattern APb. A first sidewall S1 of the isolation insulating pattern ISP may be in contact with a sidewall of the corresponding first active pattern APa, and a second sidewall S2 of the isolation insulating pattern ISP may be in contact with a sidewall of the corresponding second active pattern APb. A bottom surface B1, B2 and B3 of the isolation insulating pattern ISP may be in contact with the substrate 100 between the first sidewall S1 and the second sidewall S2 and may extend long in the second direction D2.

In some embodiments, the bottom surface B1, B2 and B3 of the isolation insulating pattern ISP may include a first bottom surface B1 adjacent to the corresponding first active pattern APa, a second bottom surface B2 adjacent to the corresponding second active pattern APb, and a recess surface RS recessed from the first and second bottom surfaces B1 and B2 into the substrate 100. The recess surface RS may include a third bottom surface B3, and the third bottom surface B3 may be located at a lower height than the first and second bottom surfaces B1 and B2 with respect to the bottom surface 100L of the substrate 100. The first bottom surface B1 and the second bottom surface B2 of the isolation insulating pattern ISP may extend long in the second direction D2, and the recess surface RS including the third bottom surface B3 may extend long in the second direction D2 between the first bottom surface B1 and the second bottom surface B2.

In some embodiments, the third bottom surface B3 may be located at a lower height than bottom surfaces ST1_B of the first device isolation patterns ST1 and bottom surfaces ST2_B of the second device isolation patterns ST2 with respect to the bottom surface 100L of the substrate 100. In some embodiments, the first bottom surface B1 of the isolation insulating pattern ISP may be located at substantially the same height as or a lower height than the bottom surfaces ST1_B of the first device isolation patterns ST1 with respect to the bottom surface 100L of the substrate 100, and the second bottom surface B2 of the isolation insulating pattern ISP may be located at substantially the same height as or a lower height than the bottom surfaces ST2_B of the second device isolation patterns ST2 with respect to the bottom surface 100L of the substrate 100.

In some embodiments, the recess surface RS of the isolation insulating pattern ISP may be disposed to be closer to the sidewall of the corresponding second active pattern APb than to the sidewall of the corresponding first active pattern APa. In this case, a length, in the first direction D1, of the second bottom surface B2 of the isolation insulating pattern ISP may be less than a length, in the first direction D1, of the first bottom surface B1 of the isolation insulating pattern ISP.

The first and second active patterns APa and APb, the first and second device isolation patterns ST1 and ST2 and the isolation insulating pattern ISP may be formed on the substrate 100 by the method of manufacturing the semiconductor device described with reference to FIGS. 1 to 11.

First channel patterns CH1 may be disposed on the first active patterns APa, respectively. The first channel patterns CH1 may be spaced apart from each other in the first direction D1. Each of the first channel patterns CH1 may include a plurality of first semiconductor patterns 104PA spaced apart from each other in the third direction D3. The first channel patterns CH1 may have various widths or pitches corresponding to those of the first active patterns APa. For example, the first channel patterns CH1 may have widths W1a and W1b in the first direction D1, and a width W1a of at least one of the first channel patterns CH1 may be different from a width W1b of another of the first channel patterns CH1.

Second channel patterns CH2 may be disposed on the second active patterns APb, respectively. The second channel patterns CH2 may be spaced apart from each other in the first direction D1. Each of the second channel patterns CH2 may include a plurality of second semiconductor patterns 104PB spaced apart from each other in the third direction D3. The second channel patterns CH2 may have a constant width or pitch corresponding to that of the second active patterns APb. For example, the second channel patterns CH2 may have widths W3 in the first direction D1, and the widths W3 of the second channel patterns CH2 may be equal to each other. The second channel patterns CH2 may have a relatively narrow width or pitch. For example, the widths W3 of the second channel patterns CH2 may be less than the widths W1a or W1b of at least some of the first channel patterns CH1.

The first channel patterns CH1 and the second channel patterns CH2 may be formed using the first preliminary channel patterns PCH1 and the second preliminary channel patterns PCH2, which are formed by the method of manufacturing the semiconductor device described with reference to FIGS. 1 to 11. For example, the first channel patterns CH1 may be formed by removing the first sacrificial patterns 102PA from the first preliminary channel patterns PCH1 of FIG. 11, and the second channel patterns CH2 may be formed by removing the second sacrificial patterns 102PB from the second preliminary channel patterns PCH2 of FIG. 11.

First source/drain patterns SD1 may be disposed on each of the first active patterns APa and may be spaced apart from each other in the second direction D2 with each of the first channel patterns CH1 interposed therebetween. The first semiconductor patterns 104PA of each of the first channel patterns CH1 may be disposed between the first source/drain patterns SD1 and may be connected to the first source/drain patterns SD1. The first source/drain patterns SD1 may be epitaxial patterns formed using the first semiconductor patterns 104PA and each of the first active patterns APa as a seed.

Second source/drain patterns SD2 may be disposed on each of the second active patterns APb and may be spaced apart from each other in the second direction D2 with each of the second channel patterns CH2 interposed therebetween. The second semiconductor patterns 104PB of each of the second channel patterns CH2 may be disposed between the second source/drain patterns SD2 and may be connected to the second source/drain patterns SD2. The second source/drain patterns SD2 may be epitaxial patterns formed using the second semiconductor patterns 104PB and each of the second active patterns APb as a seed.

The first and second source/drain patterns SD1 and SD2 may include at least one of silicon-germanium (SiGe), silicon (Si), or silicon carbide (SiC). The first and second source/drain patterns SD1 and SD2 may further include dopants. The dopants may be used to improve electrical characteristics of a transistor including the first and second source/drain patterns SD1 and SD2. When the transistor is an N-channel metal-oxide-semiconductor field effect transistor (NMOSFET), the dopants may include, for example, phosphorus (P). When the transistor is a P-channel metal-oxide-semiconductor field effect transistor (PMOSFET), the dopants may include, for example, boron (B).

Each of the first channel patterns CH1 and the first source/drain patterns SD1 may be referred to as a first active structure AS1, and the first active structure AS1 may be disposed on each of the first active patterns APa. Each of the second channel patterns CH2 and the second source/drain patterns SD2 may be referred to as a second active structure AS2, and the second active structure AS2 may be disposed on each of the second active patterns APb.

A first gate structure GS1 may be disposed on the first region R1 of the substrate 100 and may intersect the first active patterns APa and the first active structures AS1. Each of the first channel patterns CH1 may overlap with the first gate structure GS1, and the first source/drain patterns SD1 may be disposed at both sides of the first gate structure GS1, respectively. The first gate structure GS1 may include a first gate electrode GE1, a first gate insulating pattern GI1 between the first gate electrode GE1 and each of the first channel patterns CH1, first gate spacers GSP1 on sidewalls of the first gate electrode GE1, and a first gate capping pattern CAP1 on a top surface of the first gate electrode GE1. The first gate insulating pattern GI1 may extend between the first gate electrode GE1 and the first gate spacers GSP1, and a topmost surface of the first gate insulating pattern GI1 may be substantially coplanar with the top surface of the first gate electrode GE1. The first gate electrode GE1 may cover a topmost surface of each of the first channel patterns CH1 and may fill a space between each of the first channel patterns CH1 and each of the first active patterns APa and spaces between the first semiconductor patterns 104PA. The first gate insulating pattern GI1 may be disposed between the first gate electrode GE1 and each of the first semiconductor patterns 104PA. Each of the first semiconductor patterns 104PA may be spaced apart from the first gate electrode GE1 with the first gate insulating pattern GI1 interposed therebetween. The first gate structure GS1, each of the first channel patterns CH1 and the first source/drain patterns SD1 may constitute a multi-bridge channel field effect transistor.

A second gate structure GS2 may be disposed on the second region R2 of the substrate 100 and may intersect the second active patterns APb and the second active structures AS2. Each of the second channel patterns CH2 may overlap with the second gate structure GS2, and the second source/drain patterns SD2 may be disposed at both sides of the second gate structure GS2, respectively. The second gate structure GS2 may include a second gate electrode GE2, a second gate insulating pattern GI2 between the second gate electrode GE2 and each of the second channel patterns CH2, second gate spacers GSP2 on sidewalls of the second gate electrode GE2, and a second gate capping pattern CAP2 on a top surface of the second gate electrode GE2. The second gate insulating pattern GI2 may extend between the second gate electrode GE2 and the second gate spacers GSP2, and a topmost surface of the second gate insulating pattern GI2 may be substantially coplanar with the top surface of the second gate electrode GE2. The second gate electrode GE2 may cover a topmost surface of each of the second channel patterns CH2 and may fill a space between each of the second channel patterns CH2 and each of the second active patterns APb and spaces between the second semiconductor patterns 104PB. The second gate insulating pattern GI2 may be disposed between the second gate electrode GE2 and each of the second semiconductor patterns 104PB. Each of the second semiconductor patterns 104PB may be spaced apart from the second gate electrode GE2 with the second gate insulating pattern GI2 interposed therebetween. The second gate structure GS2, each of the second channel patterns CH2 and the second source/drain patterns SD2 may constitute a multi-bridge channel field effect transistor.

The first and second gate electrodes GE1 and GE2 may include a doped semiconductor material, a conductive metal nitride, and/or a metal. Each of the first and second gate insulating patterns GI1 and GI2 may include at least one of a silicon oxide layer, a silicon nitride layer, a silicon oxynitride layer, or a high-k dielectric layer. The high-k dielectric layer may include a material of which a dielectric constant is higher than that of a silicon oxide layer. For example, the high-k dielectric layer may include a hafnium oxide (HfO) layer, an aluminum oxide (AlO) layer, or a tantalum oxide (TaO) layer. Each of the first and second gate spacers GSP1 and GSP2 and the first and second gate capping patterns CAP1 and CAP2 may include at least one of a silicon oxide layer, a silicon nitride layer, or a silicon oxynitride layer.

First spacers 175A may be provided between the first gate electrode GE1 and each of the first source/drain patterns SD1. The first spacers 175A and the first semiconductor patterns 104PA may be alternately and repeatedly stacked in the third direction D3. Each of the first source/drain patterns SD1 may be in contact with the first semiconductor patterns 104PA and may be spaced apart from the first gate electrode GE1 with the first spacers 175A interposed therebetween. The first gate insulating pattern GI1 may be disposed between the first gate electrode GE1 and each of the first semiconductor patterns 104PA and may extend between the first gate electrode GE1 and each of the first spacers 175A. In some embodiments, the first spacers 175A may be omitted. In this case, each of the first source/drain patterns SD1 may be spaced apart from the first gate electrode GE1 with the first gate insulating pattern GI1 interposed therebetween and may be in direct contact with the first gate insulating pattern GI1.

Second spacers 175B may be provided between the second gate electrode GE2 and each of the second source/drain patterns SD2. The second spacers 175B and the second semiconductor patterns 104PB may be alternately and repeatedly stacked in the third direction D3. Each of the second source/drain patterns SD2 may be in contact with the second semiconductor patterns 104PB and may be spaced apart from the second gate electrode GE2 with the second spacers 175B interposed therebetween. The second gate insulating pattern GI2 may be disposed between the second gate electrode GE2 and each of the second semiconductor patterns 104PB and may extend between the second gate electrode GE2 and each of the second spacers 175B. In some embodiments, the second spacers 175B may be omitted. In this case, each of the second source/drain patterns SD2 may be spaced apart from the second gate electrode GE2 with the second gate insulating pattern GI2 interposed therebetween and may be in direct contact with the second gate insulating pattern GI2. The first and second spacers 175A and 175B may include, for example, silicon nitride.

A first interlayer insulating layer 170 may be provided on the first region R1 and the second region R2 of the substrate 100 and may cover the first and second gate structures GS1 and GS2 and the first and second source/drain patterns SD1 and SD2. Top surfaces of the first and second gate capping patterns CAP1 and CAP2 may be substantially coplanar with a top surface of the first interlayer insulating layer 170. The first gate spacers GSP1 may be disposed between the first gate capping pattern CAP1 and the first interlayer insulating layer 170, and the second gate spacers GSP2 may be disposed between the second gate capping pattern CAP2 and the first interlayer insulating layer 170. The first interlayer insulating layer 170 may extend between the first and second gate structures GS1 and GS2 on the boundary region BR of the substrate 100 and may be in contact with a top surface of the isolation insulating pattern ISP. For example, the first interlayer insulating layer 170 may include at least one of a silicon oxide layer, a silicon nitride layer, a silicon oxynitride layer, or a low-k dielectric layer.

A second interlayer insulating layer 180 may be disposed on the first interlayer insulating layer 170 and may cover the top surfaces of the first and second gate capping patterns CAP1 and CAP2. For example, the second interlayer insulating layer 180 may include at least one of a silicon oxide layer, a silicon nitride layer, a silicon oxynitride layer, or a low-k dielectric layer.

First contact plugs CT1 may penetrate the first interlayer insulating layer 170 and the second interlayer insulating layer 180 on the first region R1 of the substrate 100 so as to be electrically connected to the first source/drain patterns SD1. The first contact plugs CT1 may be disposed at both sides of the first gate structure GS1, and each of the first contact plugs CT1 may be connected to a corresponding one of the first source/drain patterns SD1. Second contact plugs CT2 may penetrate the first interlayer insulating layer 170 and the second interlayer insulating layer 180 on the second region R2 of the substrate 100 so as to be electrically connected to the second source/drain patterns SD2. The second contact plugs CT2 may be disposed at both sides of the second gate structure GS2, and each of the second contact plugs CT2 may be connected to a corresponding one of the second source/drain patterns SD2. The first and second contact plugs CT1 and CT2 may include, for example, a metal and/or a conductive metal nitride. Even though not shown in the drawings, additional contact plugs may be disposed on the first region R1 and the second region R2 of the substrate 100. Each of the additional contact plugs may penetrate the second interlayer insulating layer 180 so as to be electrically connected to a corresponding one of the first and second gate electrodes GE1 and GE2.

In some embodiments, at least one of the first and second gate structures GS1 and GS2 may form a negative capacitance (NC) field effect transistor (FET) using a negative capacitor. In this case, at least one of the first and second gate insulating patterns GI1 and GI2 may include a ferroelectric material layer having ferroelectric properties, and a paraelectric material layer having paraelectric properties. The ferroelectric material layer may have a negative capacitance, and the paraelectric material layer may have a positive capacitance. For example, when two or more capacitors are connected in series to each other and a capacitance of each of the capacitors has a positive value, a total capacitance may be reduced to be less than the capacitance of each of the capacitors. On the contrary, when at least one of two or more capacitors connected in series to each other has a negative value, a total capacitance may have a positive value and may be greater than an absolute value of a capacitance of each of the capacitors. When the ferroelectric material layer having the negative capacitance is connected in series to the paraelectric material layer having the positive capacitance, a total capacitance value of the ferroelectric and paraelectric material layers connected in series may increase. The transistor including the ferroelectric material layer may have a subthreshold swing (SS) less than 60 mV/decade at room temperature by using the increase in the total capacitance value.

The ferroelectric material layer may have the ferroelectric properties. For example, the ferroelectric material layer may include at least one of hafnium oxide, hafnium zirconium oxide, barium strontium titanium oxide, barium titanium oxide, or lead zirconium titanium oxide. For an example, the hafnium zirconium oxide may be a material formed by doping hafnium oxide with zirconium (Zr). For another example, the hafnium zirconium oxide may be a compound of hafnium (Hf), zirconium (Zr), and oxygen (O).

The ferroelectric material layer may further include dopants doped therein. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A kind of the dopants included in the ferroelectric material layer may be changed depending on a kind of the ferroelectric material included in the ferroelectric material layer. When the ferroelectric material layer includes hafnium oxide, the dopants included in the ferroelectric material layer may include at least one of, for example, gadolinium (Gd), silicon (Si), zirconium (Zr), aluminum (Al), or yttrium (Y). When the dopants are aluminum (Al), the ferroelectric material layer may include aluminum of 3 at % (atomic %) to 8 at %. Here, a ratio of the dopants may be a ratio of the amount of aluminum to a sum of the amounts of hafnium and aluminum. When the dopants are silicon (Si), the ferroelectric material layer may include silicon of 2 at % to 10 at %. When the dopants are yttrium (Y), the ferroelectric material layer may include yttrium of 2 at % to 10 at %. When the dopants are gadolinium (Gd), the ferroelectric material layer may include gadolinium of 1 at % to 7 at %. When the dopants are zirconium (Zr), the ferroelectric material layer may include zirconium of 50 at % to 80 at %.

The paraelectric material layer may have the paraelectric properties. For example, the paraelectric material layer may include at least one of silicon oxide or a metal oxide having a high-k dielectric constant. For example, the metal oxide included in the paraelectric material layer may include at least one of hafnium oxide, zirconium oxide, or aluminum oxide. However, embodiments of inventive concepts are not limited thereto.

The ferroelectric material layer and the paraelectric material layer may include the same material. The ferroelectric material layer may have the ferroelectric properties, but the paraelectric material layer may not have the ferroelectric properties. For example, when the ferroelectric material layer and the paraelectric material layer include hafnium oxide, a crystal structure of hafnium oxide included in the ferroelectric material layer may be different from a crystal structure of hafnium oxide included in the paraelectric material layer. The ferroelectric material layer may have a thickness showing the ferroelectric properties. For example, the thickness of the ferroelectric material layer may range from 0.5 nm to 10 nm. However, embodiments of inventive concepts are not limited thereto. A critical thickness showing the ferroelectric properties may be changed depending on a kind of a ferroelectric material, and thus the thickness of the ferroelectric material layer may be changed depending on a kind of the ferroelectric material included therein.

For some examples, at least one of the first and second gate insulating patterns GI1 and GI2 may include a single ferroelectric material layer. For other examples, at least one of the first and second gate insulating patterns GI1 and GI2 may include a plurality of ferroelectric material layers spaced apart from each other. In certain embodiments, at least one of the first and second gate insulating patterns GI1 and GI2 may have a stack structure in which ferroelectric material layers and paraelectric material layers are alternately stacked.

Figure 15:
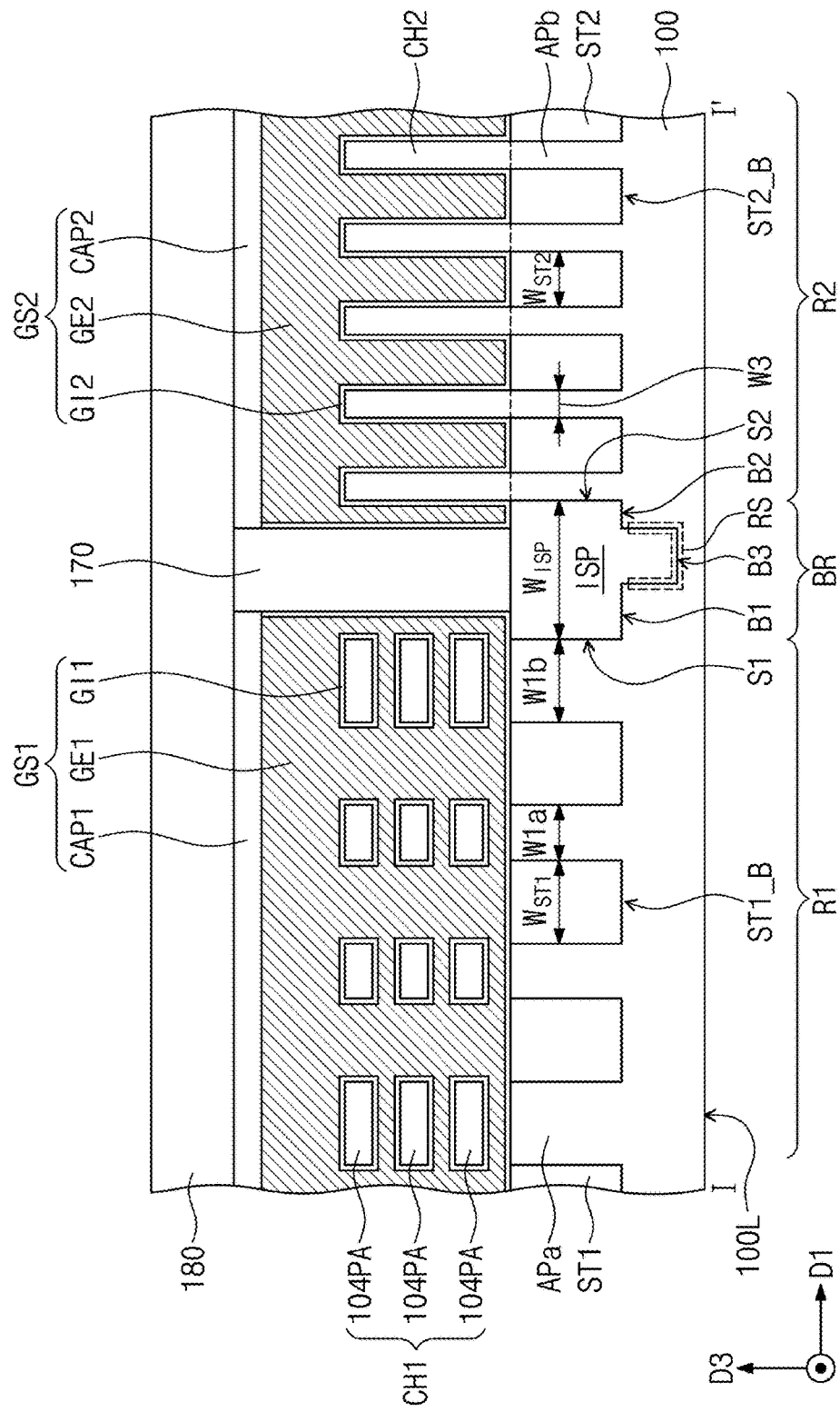
FIGS. 15 and 16 are views illustrating a semiconductor device according to some embodiments of inventive concepts.
Figure 16:
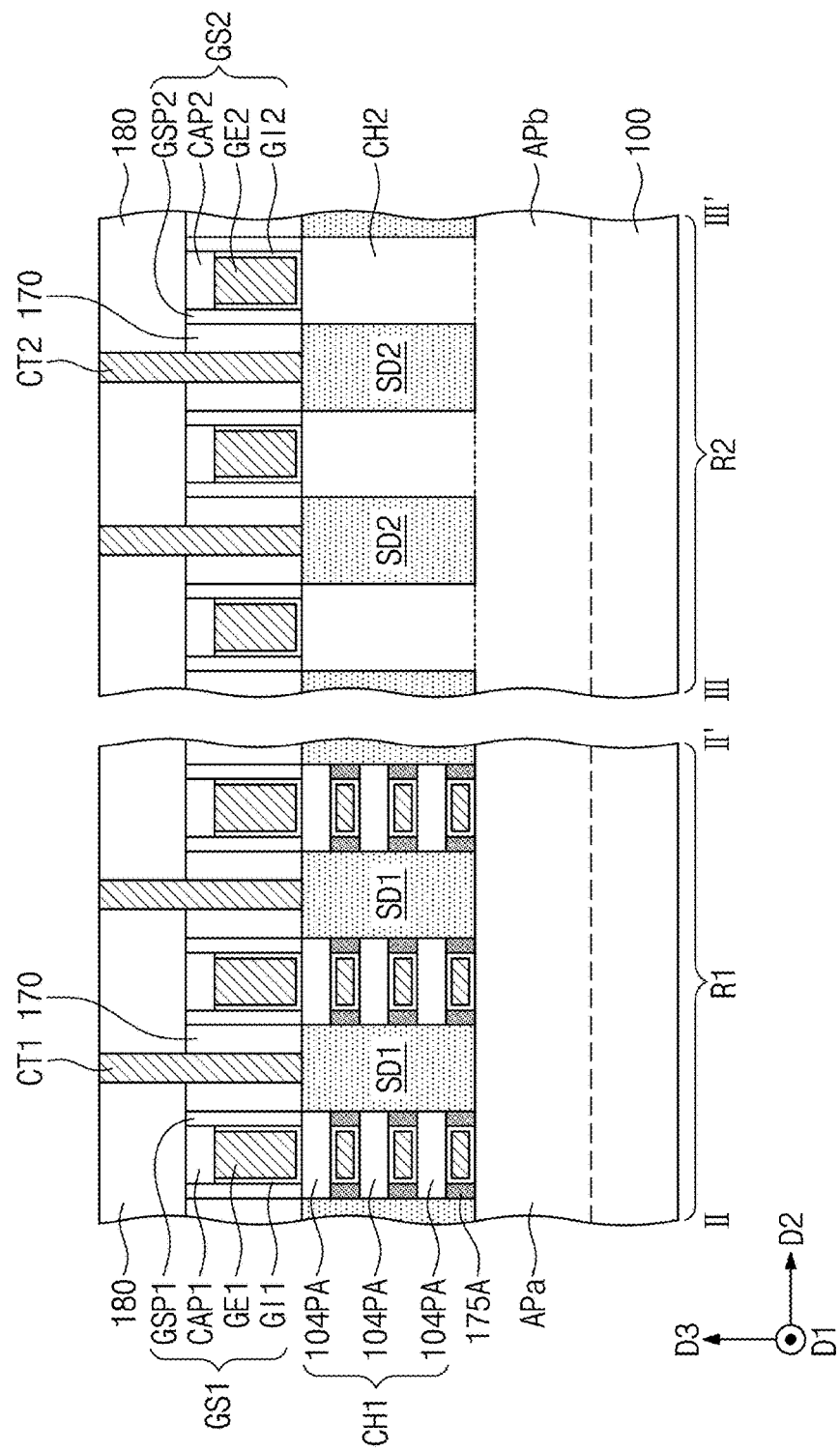

FIGS. 15 and 16 are views illustrating a semiconductor device according to some embodiments of inventive concepts, FIG. 15 is a cross-sectional view corresponding to the line I-I' of FIG. 12, and FIG. 16 is a cross-sectional view corresponding to the lines II-II' and III-III' of FIG. 12. Hereinafter, differences between the present embodiment and the embodiments described with reference to FIGS. 12 to 14 will be mainly described for the purpose of ease and convenience in explanation.

Referring to FIGS. 15 and 16, second channel patterns CH2 may be disposed on the second active patterns APb, respectively. According to the present embodiment, each of the second channel patterns CH2 may vertically protrude from each of the second active patterns APb (e.g., in the third direction D3). Each of the second channel patterns CH2 may be an upper portion of each of the second active patterns APb, which is exposed by the second device isolation patterns ST2. The second channel patterns CH2 may have a constant width or pitch corresponding to that of the second active patterns APb. For example, the second channel patterns CH2 may have widths W3 in the first direction D1, and the widths W3 of the second channel patterns CH2 may be equal to each other. The second channel patterns CH2 may have a relatively narrow width or pitch. For example, the widths W3 of the second channel patterns CH2 may be less than the widths W1a or W1b of at least some of the first channel patterns CH1. The second channel patterns CH2 may be formed by substantially the same method as described with reference to FIGS. 1 to 11.

Second source/drain patterns SD2 may be disposed on each of the second active patterns APb and may be spaced apart from each other in the second direction D2 with each of the second channel patterns CH2 interposed therebetween. The second source/drain patterns SD2 may be epitaxial patterns formed using each of the second channel patterns CH2 and each of the second active patterns APb as a seed. Each of the second channel patterns CH2 and the second source/drain patterns SD2 may be referred to as a second active structure AS2, and the second active structure AS2 may be disposed on each of the second active patterns APb.

A second gate structure GS2 may be disposed on the second region R2 of the substrate 100 and may intersect the second active patterns APb and the second active structures AS2. Each of the second channel patterns CH2 may overlap with the second gate structure GS2, and the second source/drain patterns SD2 may be disposed at both sides of the second gate structure GS2, respectively. Each of the second channel patterns CH2 may have sidewalls opposite to each other in the first direction D1, and the second gate structure GS2 may cover the opposite sidewalls of each of the second channel patterns CH2. The second gate electrode GE2 of the second gate structure GS2, each of the second channel patterns CH2 and the second source/drain patterns SD2 may constitute a fin field effect transistor. Thus, the second spacers 175B described with reference to FIGS. 12 to 14 may not be provided.

According to the present embodiment, the first gate electrode GE1, each of the first channel patterns CH1 and the first source/drain patterns SD1 on the first region R1 of the substrate 100 may constitute the multi-bridge channel field effect transistor, and the second gate electrode GE2, each of the second channel patterns CH2 and the second source/drain patterns SD2 on the second region R2 of the substrate 100 may constitute the fin field effect transistor. In this case, the first active patterns APa and the first channel patterns CH1 may have the various widths or pitches, and the second active patterns APb and the second channel patterns CH2 may have the relatively narrow and constant width or pitch.

FIGS. 17 to 21 are cross-sectional views illustrating a method of manufacturing a semiconductor device according to some embodiments of inventive concepts. Hereinafter, differences between the present embodiment and the embodiments described with reference to FIGS. 1 to 11 will be mainly described for the purpose of ease and convenience in explanation.

Figure 17:
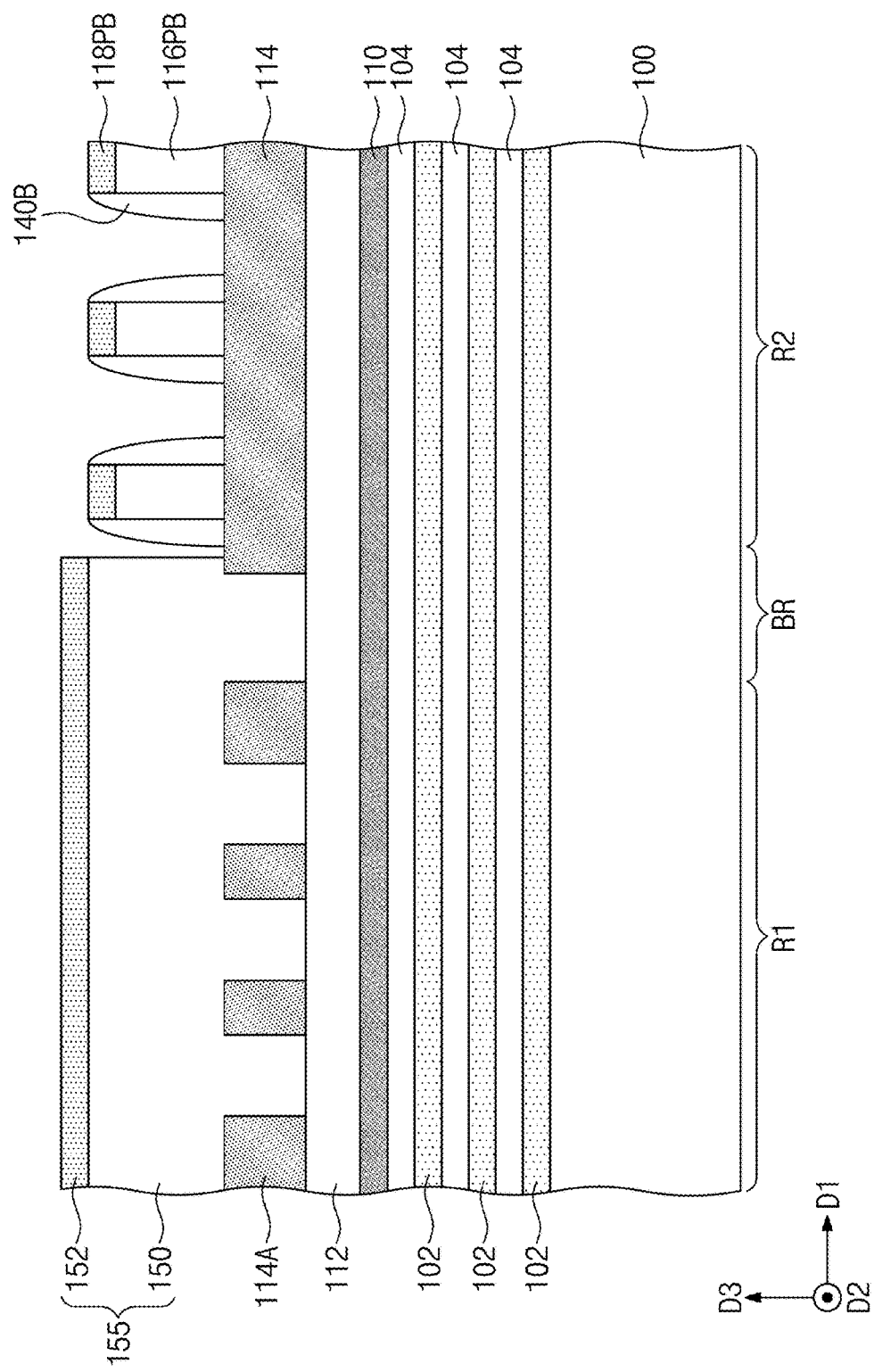
FIGS. 17 to 21 are cross-sectional views illustrating a method of manufacturing a semiconductor device according to some embodiments of inventive concepts.

Referring to FIG. 17, a second mask pattern 155 may be formed on the first region R1 of the substrate 100 and may cover the first intermediate mask patterns 114A on the first region R1. According to the present embodiment, the second mask pattern 155 may extend onto the boundary region BR of the substrate 100 to cover the top surface of the sub-lower mask layer 112 on the boundary region BR and may cover a portion of the remaining portion of the intermediate mask layer 114, which extends onto the boundary region BR. In other words, the second mask pattern 155 may partially overlap with the remaining portion of the intermediate mask layer 114 on the boundary region BR. The second mask pattern 155 may expose the second upper mask patterns 118PB, the second sub-upper mask patterns 116PB, the second spacer patterns 140B and another portion of the remaining portion of the intermediate mask layer 114, which are provided on the second region R2.

Figure 18:
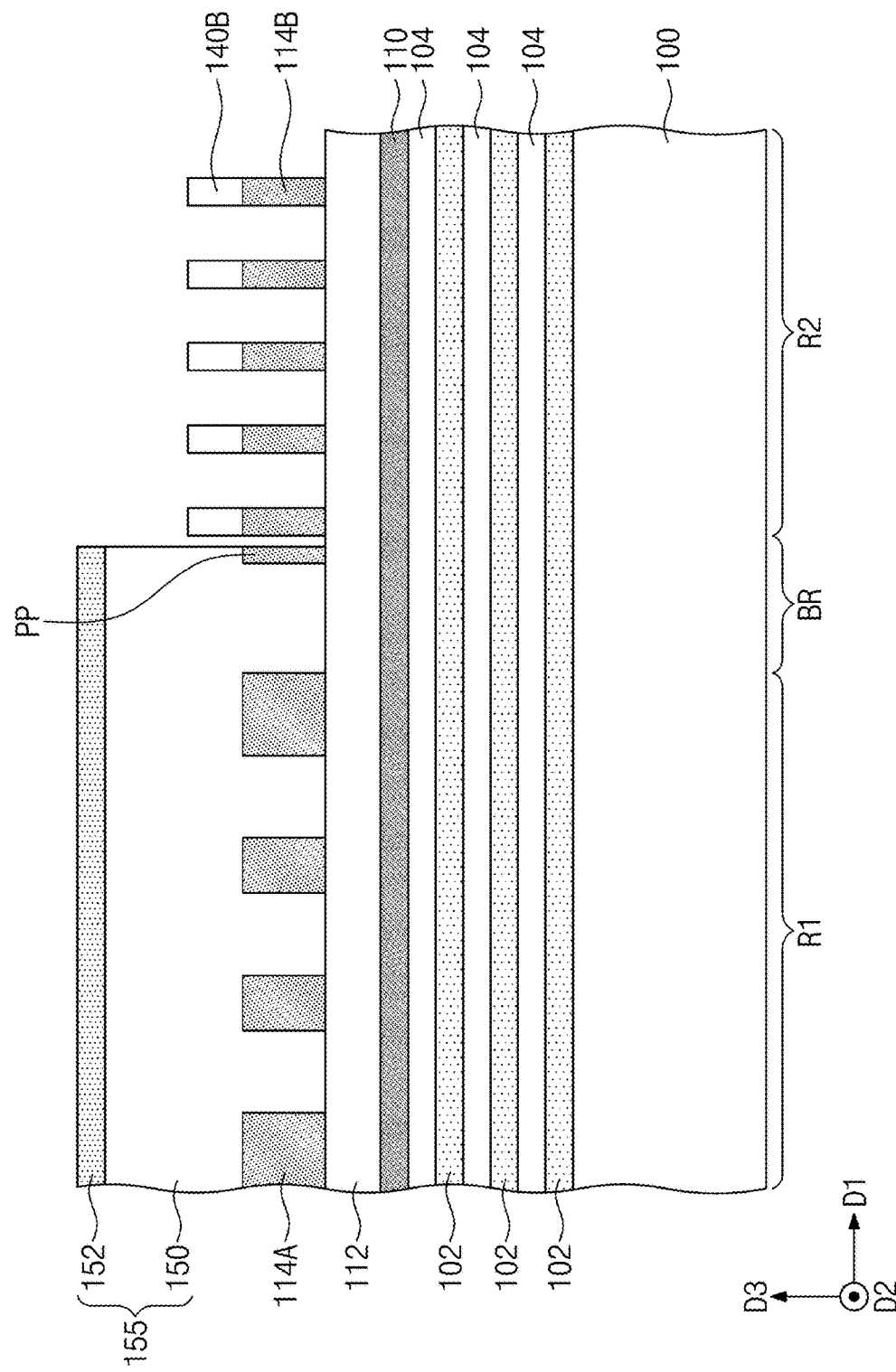

Referring to FIG. 18, the second upper mask patterns 118PB and the second sub-upper mask patterns 116PB on the second region R2 may be selectively removed. After the removal of the second upper mask patterns 118PB and the second sub-upper mask patterns 116PB, an etching process may be performed using the second mask pattern 155 and the second spacer patterns 140B as etch masks. The remaining portion of the intermediate mask layer 114 on the second region R2 may be etched using the second spacer patterns 140B as etch masks during the etching process, and thus second intermediate mask patterns 114B may be formed on the second region R2. The second intermediate mask patterns 114B may be spaced apart from each other in the first direction D1 and may extend long in the second direction D2.

According to the present embodiment, since the second mask pattern 155 partially overlaps with the remaining portion of the intermediate mask layer 114 on the boundary region BR, a portion of the intermediate mask layer 114 may not be etched but may remain on the boundary region BR. Thus, a protrusion PP may be formed on the sub-lower mask layer 112 on the boundary region BR. The second mask pattern 155 on the first region R1 may extend long in the second direction D2, and thus the protrusion PP may have a line shape extending long in the second direction D2.

Figure 19:
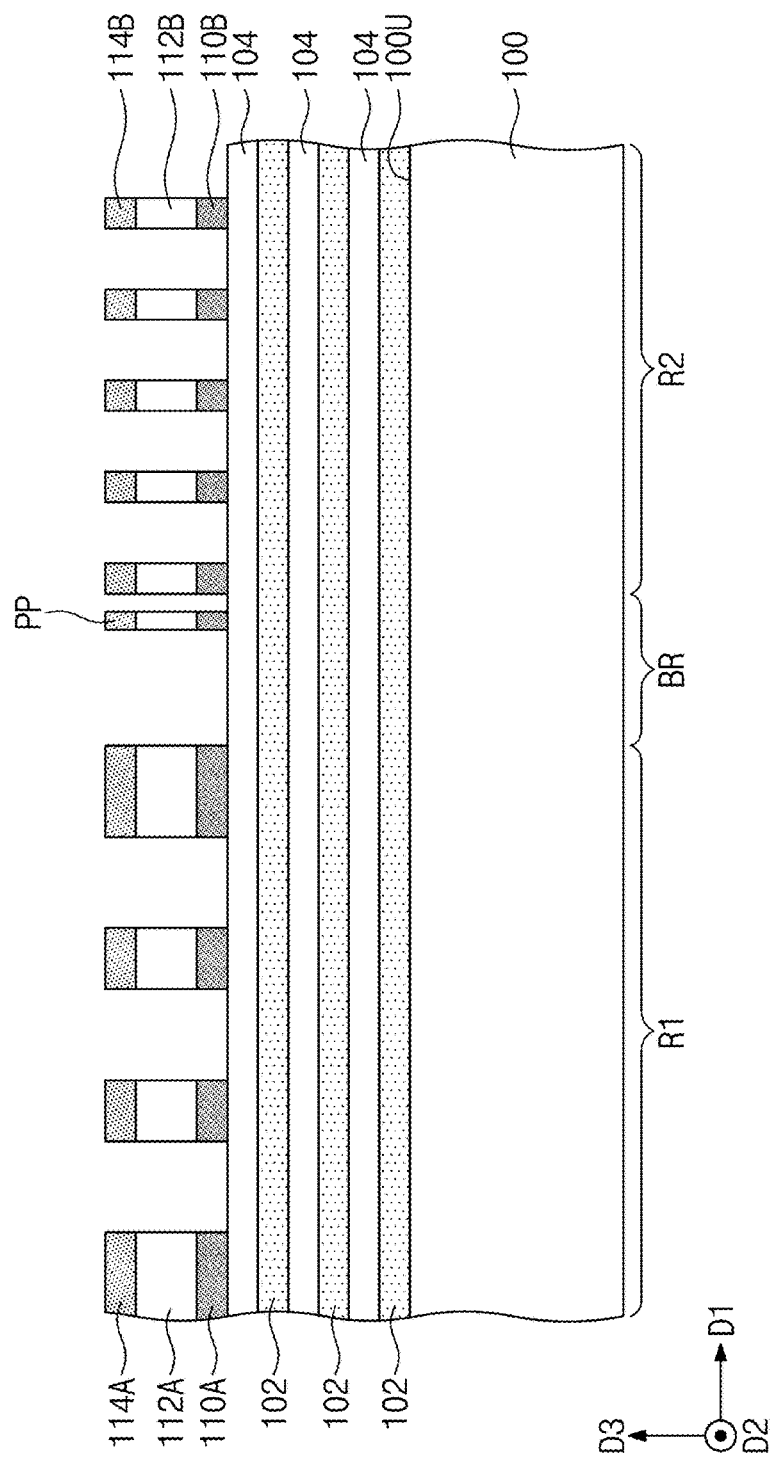

Referring to FIG. 19, the second mask pattern 155 may be removed by, for example, an ashing process and/or a strip process. Thereafter, the sub-lower mask layer 112 and the lower mask layer 110 may be etched using the first and second intermediate mask patterns 114A and 114B and remaining portions of the second spacer patterns 140B as etch masks. Sub-lower mask patterns 112A and 112B and lower mask patterns 110A and 110B may be formed on the uppermost semiconductor layer 104 by the etching of the sub-lower mask layer 112 and the lower mask layer 110. The sub-lower mask patterns 112A and 112B may be spaced apart from each other in the first direction D1 and may extend long in the second direction D2. The lower mask patterns 110A and 110B may be spaced apart from each other in the first direction D1 and may extend long in the second direction D2.

The sub-lower mask patterns 112A and 112B may include first sub-lower mask patterns 112A on the first region R1, and second sub-lower mask patterns 112B on the second region R2. The lower mask patterns 110A and 110B may include first lower mask patterns 110A on the first region R1, and second lower mask patterns 110B on the second region R2.

In the present embodiment, the protrusion PP may function as an etch mask during the etching of the sub-lower mask layer 112 and the lower mask layer 110. Thus, the protrusion PP including a remaining portion of the sub-lower mask layer 112 and a remaining portion of the lower mask layer 110 may be formed on the uppermost semiconductor layer 104 on the boundary region BR. The protrusion PP may be formed between the first sub-lower mask patterns 112A and the second sub-lower mask patterns 112B and between the first lower mask patterns 110A and the second lower mask patterns 110B and may have a line shape extending long in the second direction D2.

Figure 20:
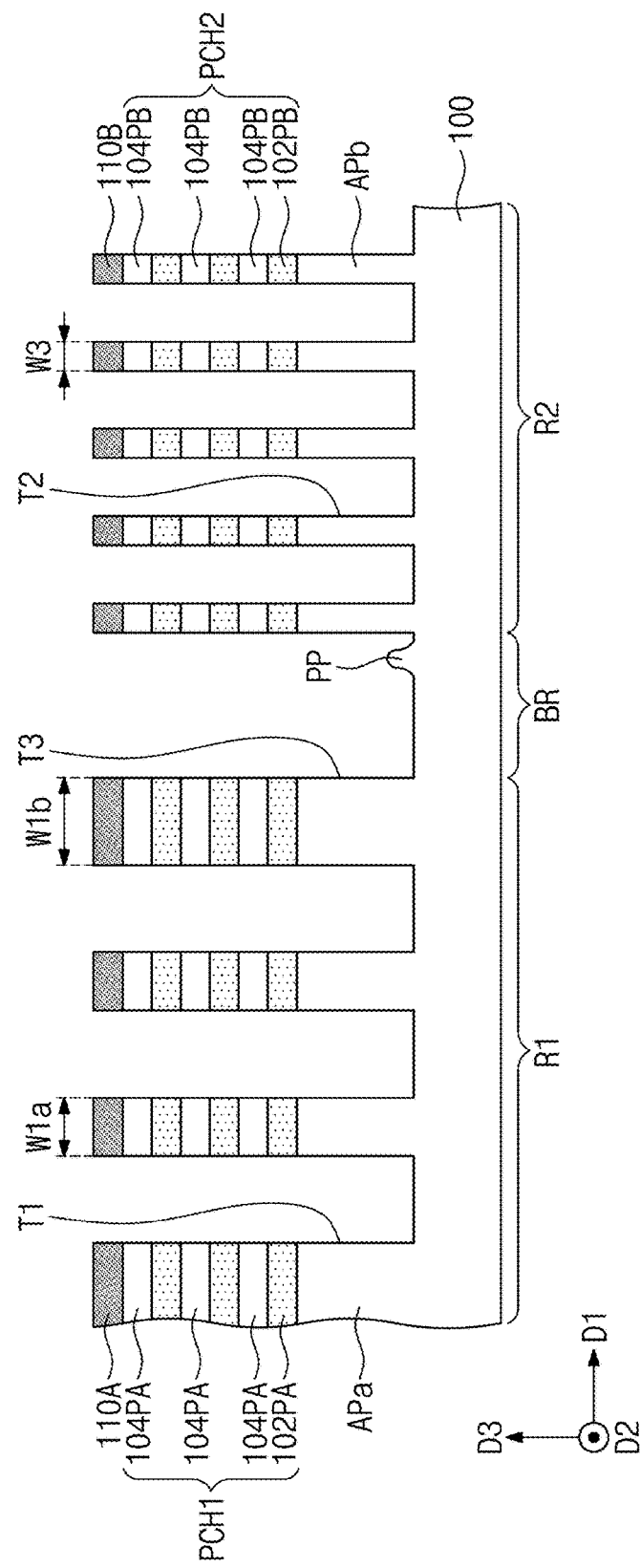

Referring to FIG. 20, the semiconductor layers 104, the sacrificial layers 102 and an upper portion of the substrate 100 may be etched using remaining portions of the intermediate mask patterns 114A and 114B, the sub-lower mask patterns 112A and 112B and the lower mask patterns 110A and 110B as etch masks.

Preliminary channel patterns PCH1 and PCH2 may be formed on the substrate 100 by the etching of the semiconductor layers 104 and the sacrificial layers 102. The preliminary channel patterns PCH1 and PCH2 may be spaced apart from each other in the first direction D1 and may extend long in the second direction D2. The preliminary channel patterns PCH1 and PCH2 may include first preliminary channel patterns PCH1 on the first region R1, and second preliminary channel patterns PCH2 on the second region R2. Each of the first preliminary channel patterns PCH1 may include first sacrificial patterns 102PA and first semiconductor patterns 104PA which are alternately stacked on the first region R1 of the substrate 100, and each of the second preliminary channel patterns PCH2 may include second sacrificial patterns 102PB and second semiconductor patterns 104PB which are alternately stacked on the second region R2 of the substrate 100.

Since the upper portion of the substrate 100 is etched, trenches T1, T2 and T3 defining active patterns APa and APb may be formed in the substrate 100. The active patterns APa and APb may be spaced apart from each other in the first direction D1 and may extend long in the second direction D2. The trenches T1, T2 and T3 may include first trenches T1 formed in the first region R1 of the substrate 100 to define first active patterns APa, second trenches T2 formed in the second region R2 of the substrate 100 to define second active patterns APb, and a third trench T3 formed in the boundary region BR of the substrate 100. The first preliminary channel patterns PCH1 may be formed on the first active patterns APa, respectively, and the second preliminary channel patterns PCH2 may be formed on the second active patterns APb, respectively.

The third trench T3 may be formed between a corresponding one of the first active patterns APa and a corresponding one of the second active patterns APb. The third trench T3 may expose a sidewall of the corresponding first active pattern APa and a sidewall of the corresponding second active pattern APb. A bottom surface of the third trench T3 may expose the substrate 100 of the boundary region BR. During the etching process for the formation of the first and second preliminary channel patterns PCH1 and PCH2 and the first and second active patterns APa and APb, the protrusion PP may be transferred to the boundary region BR of the substrate 100, and thus the protrusion PP may be formed on the bottom surface of the third trench T3. The protrusion PP may have a line shape extending long in the second direction D2, as described with reference to FIG. 19.

Figure 21:
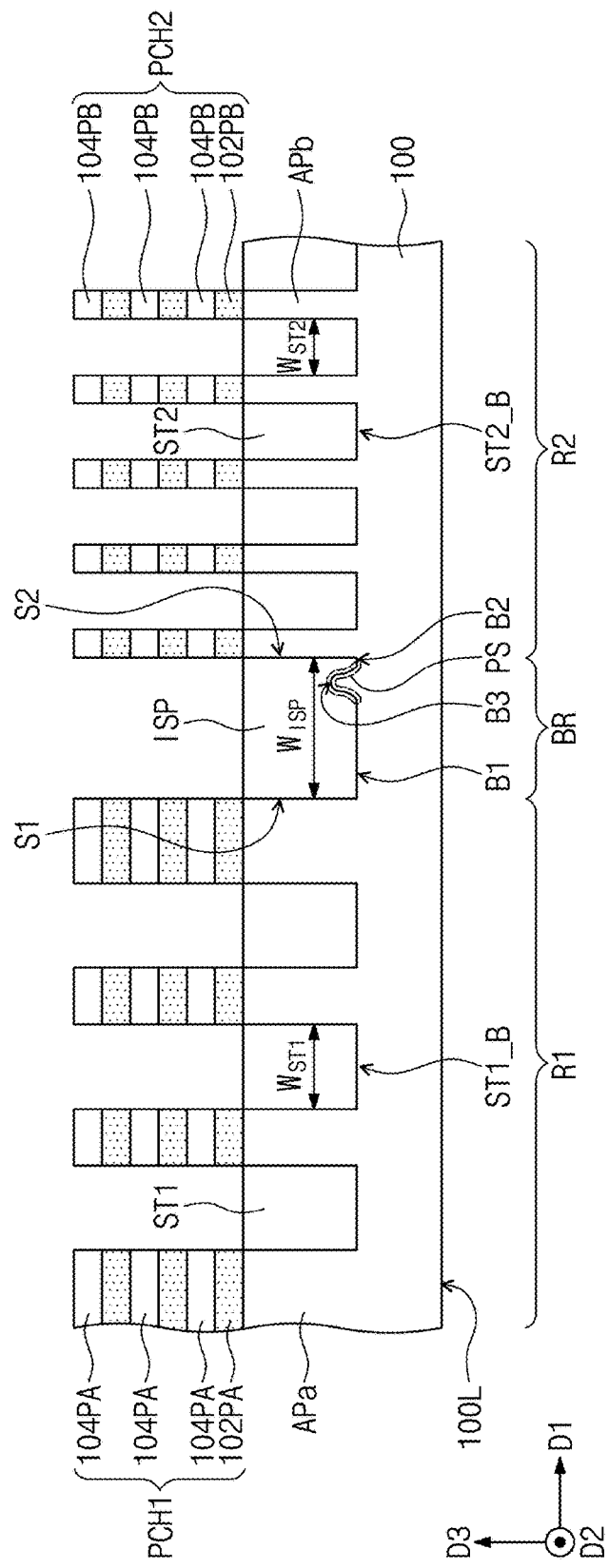

Referring to FIG. 21, first device isolation patterns ST1, second device isolation patterns ST2 and an isolation insulating pattern ISP may be formed in the first trenches T1, the second trenches T2 and the third trench T3, respectively. In the present embodiment, the isolation insulating pattern ISP may be formed to cover the protrusion PP. The first device isolation patterns ST1 may be disposed between the first active patterns APa on the first region R1, and the second device isolation patterns ST2 may be disposed between the second active patterns APb on the second region R2. The isolation insulating pattern ISP may be disposed on the boundary region BR between the first active patterns APa and the second active patterns APb.

The isolation insulating pattern ISP may be disposed between a corresponding one of the first active patterns APa and a corresponding one of the second active patterns APb. A first sidewall S1 of the isolation insulating pattern ISP may be in contact with a sidewall of the corresponding first active pattern APa, and a second sidewall S2 of the isolation insulating pattern ISP may be in contact with a sidewall of the corresponding second active pattern APb. A bottom surface B1, B2 and B3 of the isolation insulating pattern ISP may be in contact with the substrate 100 between the first sidewall S1 and the second sidewall S2.

The bottom surface B1, B2 and B3 of the isolation insulating pattern ISP may include a first bottom surface B1 adjacent to the corresponding first active pattern APa, a second bottom surface B2 adjacent to the corresponding second active pattern APb, and a third bottom surface B3 between the first bottom surface B1 and the second bottom surface B2. The third bottom surface B3 of the isolation insulating pattern ISP may be located at a different height from those of the first and second bottom surfaces B1 and B2 with respect to a bottom surface 100L of the substrate 100.

In the present embodiment, the isolation insulating pattern ISP may be formed to cover the protrusion PP, and thus the bottom surface of the isolation insulating pattern ISP may include a protrusion surface PS protruding from the first and second bottom surfaces B1 and B2 toward the inside of the isolation insulating pattern ISP. In this case, the protrusion surface PS may include the third bottom surface B3, and the third bottom surface B3 may be located at a higher height than the first and second bottom surfaces B1 and B2 with respect to the bottom surface 100L of the substrate 100. The third bottom surface B3 of the isolation insulating pattern ISP may be located at a higher height than bottom surfaces ST1_B of the first device isolation patterns ST1 and bottom surfaces ST2_B of the second device isolation patterns ST2 with respect to the bottom surface 100L of the substrate 100.

In some embodiments, the first bottom surface B1 of the isolation insulating pattern ISP may be located at substantially the same height as or a lower height than the bottom surfaces ST1_B of the first device isolation patterns ST1 with respect to the bottom surface 100L of the substrate 100, and the second bottom surface B2 of the isolation insulating pattern ISP may be located at substantially the same height as or a lower height than the bottom surfaces ST2_B of the second device isolation patterns ST2 with respect to the bottom surface 100L of the substrate 100.

In some embodiments, the protrusion surface PS of the isolation insulating pattern ISP may be disposed to be closer to the sidewall of the corresponding second active pattern APb than to the sidewall of the corresponding first active pattern APa. In this case, a length, in the first direction D1, of the second bottom surface B2 of the isolation insulating pattern ISP may be less than a length, in the first direction D1, of the first bottom surface B1 of the isolation insulating pattern ISP.

The isolation insulating pattern ISP may extend long in the second direction D2 between the corresponding first active pattern APa and the corresponding second active pattern APb. In other words, the first bottom surface B1 and the second bottom surface B2 of the isolation insulating pattern ISP may extend long in the second direction D2, and the protrusion surface PS including the third bottom surface B3 may extend long in the second direction D2 between the first bottom surface B1 and the second bottom surface B2.

Figure 22:
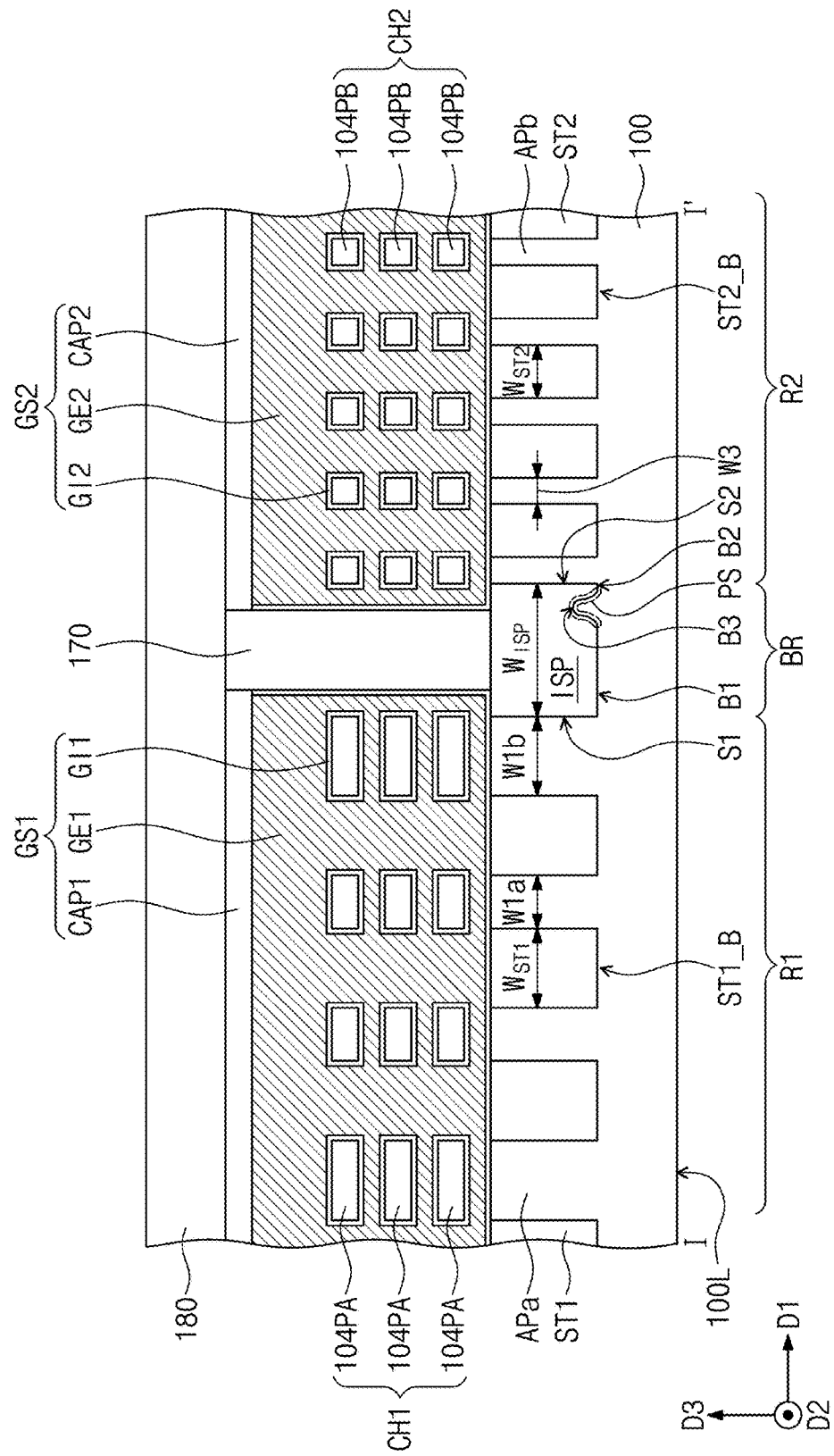
FIG. 22 is a cross-sectional view corresponding to the line I-I' of FIG. 12 to illustrate a semiconductor device according to some embodiments of inventive concepts.

FIG. 22 is a cross-sectional view corresponding to the line I-I' of FIG. 12 to illustrate a semiconductor device according to some embodiments of inventive concepts. Hereinafter, differences between the present embodiment and the embodiments described with reference to FIGS. 12 to 14 will be mainly described for the purpose of ease and convenience in explanation.

Referring to FIGS. 12 and 22, the isolation insulating pattern ISP may be disposed between a corresponding one of the first active patterns APa and a corresponding one of the second active patterns APb. The isolation insulating pattern ISP may extend long in the second direction D2 between the corresponding first active pattern APa and the corresponding second active pattern APb. A first sidewall S1 of the isolation insulating pattern ISP may be in contact with a sidewall of the corresponding first active pattern APa, and a second sidewall S2 of the isolation insulating pattern ISP may be in contact with a sidewall of the corresponding second active pattern APb. A bottom surface B1, B2 and B3 of the isolation insulating pattern ISP may be in contact with the substrate 100 between the first sidewall S1 and the second sidewall S2 and may extend long in the second direction D2.

In present embodiment, the bottom surface B1, B2 and B3 of the isolation insulating pattern ISP may include a first bottom surface B1 adjacent to the corresponding first active pattern APa, a second bottom surface B2 adjacent to the corresponding second active pattern APb, and a protrusion surface PS protruding from the first and second bottom surfaces B1 and B2 toward the inside of the isolation insulating pattern ISP. The protrusion surface PS may include a third bottom surface B3, and the third bottom surface B3 may be located at a higher height than the first and second bottom surfaces B1 and B2 with respect to the bottom surface 100L of the substrate 100. The first bottom surface B1 and the second bottom surface B2 of the isolation insulating pattern ISP may extend long in the second direction D2, and the protrusion surface PS including the third bottom surface B3 may extend long in the second direction D2 between the first bottom surface B1 and the second bottom surface B2.

In some embodiments, the third bottom surface B3 may be located at a higher height than bottom surfaces ST1_B of the first device isolation patterns ST1 and bottom surfaces ST2_B of the second device isolation patterns ST2 with respect to the bottom surface 100L of the substrate 100. In some embodiments, the first bottom surface B1 of the isolation insulating pattern ISP may be located at substantially the same height as or a lower height than the bottom surfaces ST1_B of the first device isolation patterns ST1 with respect to the bottom surface 100L of the substrate 100, and the second bottom surface B2 of the isolation insulating pattern ISP may be located at substantially the same height as or a lower height than the bottom surfaces ST2_B of the second device isolation patterns ST2 with respect to the bottom surface 100L of the substrate 100.

In some embodiments, the protrusion surface PS of the isolation insulating pattern ISP may be disposed to be closer to the sidewall of the corresponding second active pattern APb than to the sidewall of the corresponding first active pattern APa. In this case, a length, in the first direction D1, of the second bottom surface B2 of the isolation insulating pattern ISP may be less than a length, in the first direction D1, of the first bottom surface B1 of the isolation insulating pattern ISP.

The first and second active patterns APa and APb, the first and second device isolation patterns ST1 and ST2 and the isolation insulating pattern ISP may be formed on the substrate 100 by the method of manufacturing the semiconductor device described with reference to FIGS. 17 to 21.

According to embodiments of inventive concepts, the semiconductor device including the active patterns having various widths or pitches may be easily manufactured. In addition, the active patterns may be formed using the photoresist patterns formed by the single exposure process using the single photomask, and thus the manufacturing cost of the semiconductor device may be reduced.

While some embodiments of inventive concepts have been described, inventive concepts are not limited to the embodiments described above, and it will be understood by one of ordinary skill in the art that variations in form and detail may be made therein without departing from the spirit and scope of inventive concepts.

What is claimed is:

1. A semiconductor device comprising:
a substrate including a first region, a second region, and a boundary region between the first region and the second region;
first active patterns on the first region of the substrate and spaced apart from each other in a first direction parallel to a bottom surface of the substrate;
second active patterns on the second region of the substrate and spaced apart from each other in the first direction; and
an isolation insulating pattern on the boundary region of the substrate, the isolation insulating pattern between the first active patterns and the second active patterns, wherein
the isolation insulating pattern is between a corresponding first active pattern of the first active patterns and a corresponding second active pattern of the second active patterns, and
a bottom surface of the isolation insulating pattern includes a first bottom surface adjacent to the corresponding first active pattern, a second bottom surface adjacent to the corresponding second active pattern, and a protrusion surface protruding from the first bottom surface and the second bottom surface toward an inside of the isolation insulating pattern, wherein
the protrusion surface includes a first sidewall and a second sidewall,
the first sidewall protrudes from the first bottom surface toward to the inside of the isolation insulating pattern,
the second sidewall protrudes from the second bottom surface toward the inside of the isolation insulating pattern, and
a horizontal distance between the first sidewall and the second sidewall decreases as a vertical level of the protrusion surface increases.

2. The semiconductor device of claim 1, wherein
the first active patterns and the second active patterns extend long in a second direction,
the second direction is parallel to the bottom surface of the substrate and intersects the first direction,
the isolation insulating pattern extends long in the second direction between the corresponding first active pattern and the corresponding second active pattern, and
the protrusion surface extends long in the second direction.

3. The semiconductor device of claim 1, wherein
each of the first active patterns and the second active patterns has a width in the first direction, at least some of the first active patterns have different widths, and the second active patterns have equal widths.

4. The semiconductor device of claim 1, further comprising:
first device isolation patterns between the first active patterns,
wherein the protrusion surface of the isolation insulating pattern is located at a higher height than bottom surfaces of the first device isolation patterns with respect to the bottom surface of the substrate.

5. The semiconductor device of claim 4, further comprising:
second device isolation patterns between the second active patterns,
wherein the protrusion surface of the isolation insulating pattern is located at a higher height than bottom surfaces of the second device isolation patterns with respect to the bottom surface of the substrate.

6. The semiconductor device of claim 1, further comprising:
first channel patterns on the first active patterns, respectively,
wherein each of the first channel patterns includes a plurality of first semiconductor patterns vertically spaced apart from each other on each of the first active patterns.

7. The semiconductor device of claim 6, further comprising:
second channel patterns on the second active patterns, respectively,
wherein each of the second channel patterns includes a plurality of second semiconductor patterns vertically spaced apart from each other on each of the second active patterns.

8. The semiconductor device of claim 1, wherein
a first sidewall of the isolation insulating pattern is in contact with the corresponding first active pattern,
a second sidewall of the isolation insulating pattern is in contact with the corresponding second active pattern,
the bottom surface of the isolation insulating pattern is in contact with the substrate between the first sidewall and the second sidewall.

9. The semiconductor device of claim 1, wherein
each of the first active patterns and the second active patterns has a width in the first direction, and
widths of the second active patterns are less than widths of at least some of the first active patterns.

10. The semiconductor device of claim 1, further comprising;
first device isolation patterns between the first active patterns; and
second device isolation patterns between the second active patterns,
wherein each of the first device isolation patterns has a first width in the first direction, each of the second device isolation patterns has a second width in the first direction, and the isolation insulating pattern has a third width in the first direction,
wherein the third width is greater than the first width and the second width.

11. A semiconductor device comprising:
a substrate including a first region, a second region, and a boundary region between the first region and the second region;
first active patterns on the first region of the substrate;
second active patterns on the second region of the substrate; and
an isolation insulating pattern on the boundary region of the substrate, the isolation insulating pattern between the first active patterns and the second active patterns, wherein
the isolation insulating pattern is between a corresponding first active pattern of the first active patterns and a corresponding second active pattern of the second active patterns,
a bottom surface of the isolation insulating pattern includes a first bottom surface adjacent to the corresponding first active pattern, a second bottom surface adjacent to the corresponding second active pattern, and a protrusion surface between the first bottom surface and the second bottom surface,
the protrusion surface includes a third bottom surface is located at a higher height than the first bottom surface and the second bottom surface with respect to a bottom surface of the substrate,
the protrusion surface of the isolation insulating pattern is closer to a sidewall of the corresponding second active pattern than to a sidewall of the corresponding first active pattern.

12. The semiconductor device of claim 11, wherein
the first active patterns and the second active patterns are spaced apart from each other in a first direction parallel to the bottom surface of the substrate and extend long in a second direction which is parallel to the bottom surface of the substrate and intersects the first direction,
each of the first active patterns and the second active patterns has a width in the first direction, and
a width of at least one of the first active patterns is different from a width of an other of the first active patterns.

13. The semiconductor device of claim 12, wherein widths of the second active patterns are equal to each other.

14. The semiconductor device of claim 12, wherein widths of the second active patterns are less than widths of at least some of the first active patterns.

15. The semiconductor device of claim 12, further comprising:
first device isolation patterns between the first active patterns; and
second device isolation patterns between the second active patterns,
wherein each of the first device isolation patterns has a first width in the first direction, each of the second device isolation patterns has a second width in the first direction, and the isolation insulating pattern has a third width in the first direction,
wherein the third width is greater than the first width and the second width.

16. The semiconductor device of claim 12, wherein the isolation insulating pattern extends long in the second direction between the corresponding first active pattern and the corresponding second active pattern, and
wherein the first bottom surface, the second bottom surface, and the protrusion surface of the isolation insulating pattern extend long in the second direction.

17. The semiconductor device of claim 11, further comprising:
first device isolation patterns between the first active patterns,
wherein the third bottom surface of the isolation insulating pattern is located at a higher height than bottom surfaces of the first device isolation patterns with respect to the bottom surface of the substrate.

18. The semiconductor device of claim 17, further comprising:
- second device isolation patterns between the second active patterns,
- wherein the third bottom surface of the isolation insulating pattern is located at a higher height than bottom surfaces of the second device isolation patterns with respect to the bottom surface of the substrate.

19. The semiconductor device of claim 11, further comprising:
- first channel patterns on the first active patterns, respectively; and
- second channel patterns on the second active patterns, respectively,
- wherein each of the first channel patterns includes a plurality of first semiconductor patterns vertically spaced apart from each other on each of the first active patterns.

\* \* \* \* \*